United States Patent
Yu et al.

(10) Patent No.: US 6,350,639 B1
(45) Date of Patent: Feb. 26, 2002

(54) SIMPLIFIED GRADED LDD TRANSISTOR USING CONTROLLED POLYSILICON GATE PROFILE

(75) Inventors: Allen S. Yu, Fremont; Patrick K. Cheung, Sunnyvale; Paul J. Steffan, Elk Grove, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/832,684

(22) Filed: Apr. 10, 2001

Related U.S. Application Data

(62) Division of application No. 09/162,116, filed on Sep. 28, 1998, now Pat. No. 6,274,443.

(51) Int. Cl.⁷ .......................................... H01L 21/8238
(52) U.S. Cl. .................. 438/199; 438/210; 438/223; 438/228; 438/229; 438/230; 438/231
(58) Field of Search ................................ 438/199, 200, 438/210, 223, 224, 227, 228, 229, 230, 231, 232

(56) References Cited

U.S. PATENT DOCUMENTS

| | | | |
|---|---|---|---|
| 3,673,679 A | * 7/1972 | Carbajal, III et al. | ....... 438/227 |
| 4,470,191 A | * 9/1984 | Cottrell et al. | ............... 438/442 |
| 4,830,974 A | * 5/1989 | Chang et al. | ............... 438/201 |
| 5,296,401 A | * 3/1994 | Mitsui et al. | ............... 438/231 |
| 5,427,971 A | * 6/1995 | Lee et al. | .................... 438/303 |
| 6,191,044 B1 | * 2/2001 | Yu et al. | ..................... 438/713 |

* cited by examiner

*Primary Examiner*—Charles Bowers
*Assistant Examiner*—Jack Chen
(74) *Attorney, Agent, or Firm*—Miko Ishimaru

(57) ABSTRACT

An ultra-large scale CMOS integrated circuit semiconductor device with LDD structures is manufactured by forming a gate oxide layer over the semiconductor substrate; forming a polysilicon layer over the gate oxide layer; forming a first mask layer over the polysilicon layer; patterning and etching the first mask layer to form a first gate mask; anisotropically etching the polysilicon layer to form a first polysilicon gate, wherein the first polysilicon gate has sidewalls with sloped profiles and the sloped profiles are used as masks during the ion implantation of the LDD structures to space the resultant LDD structures away from the edges of second polysilicon gates to be formed subsequently with substantially vertical profiles.

6 Claims, 28 Drawing Sheets

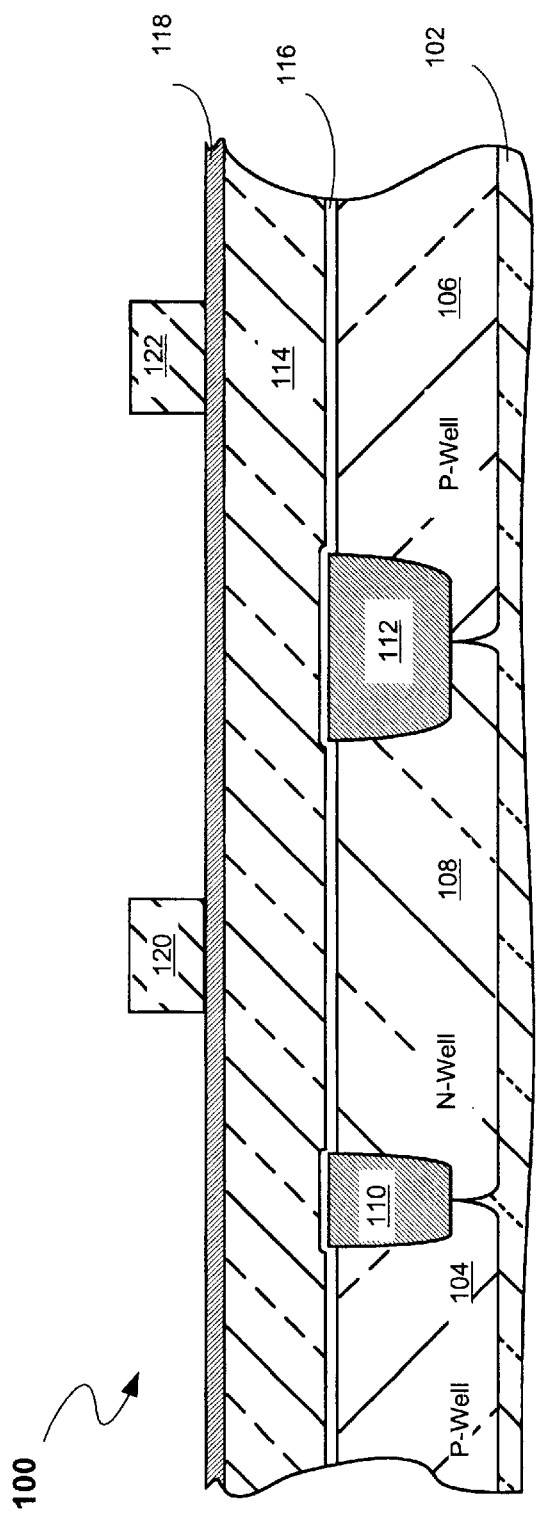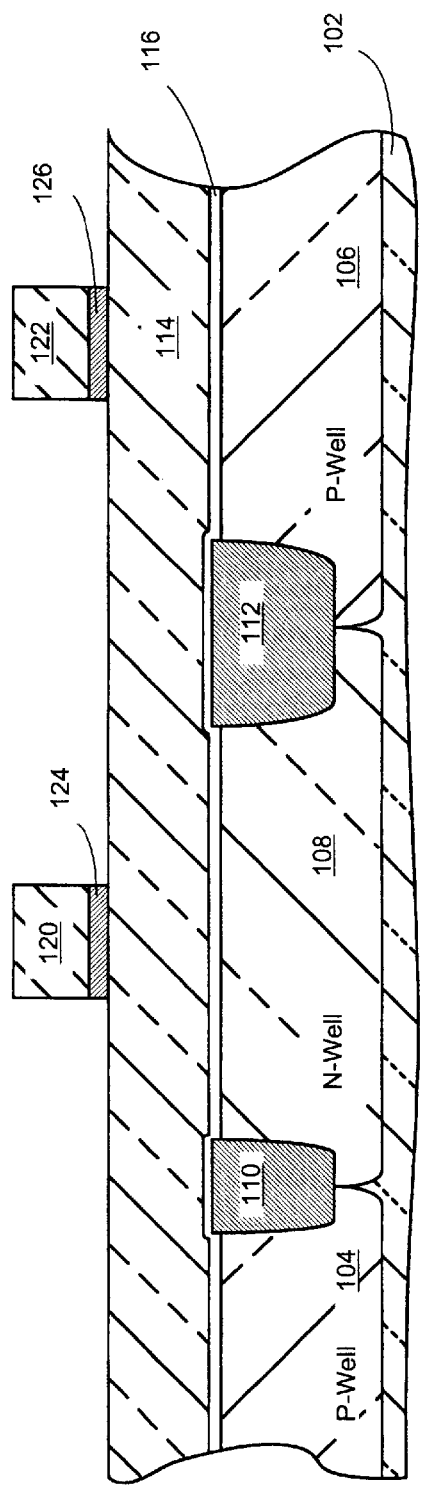
FIG. 1A (PRIOR ART)
FIG. 1B (PRIOR ART)

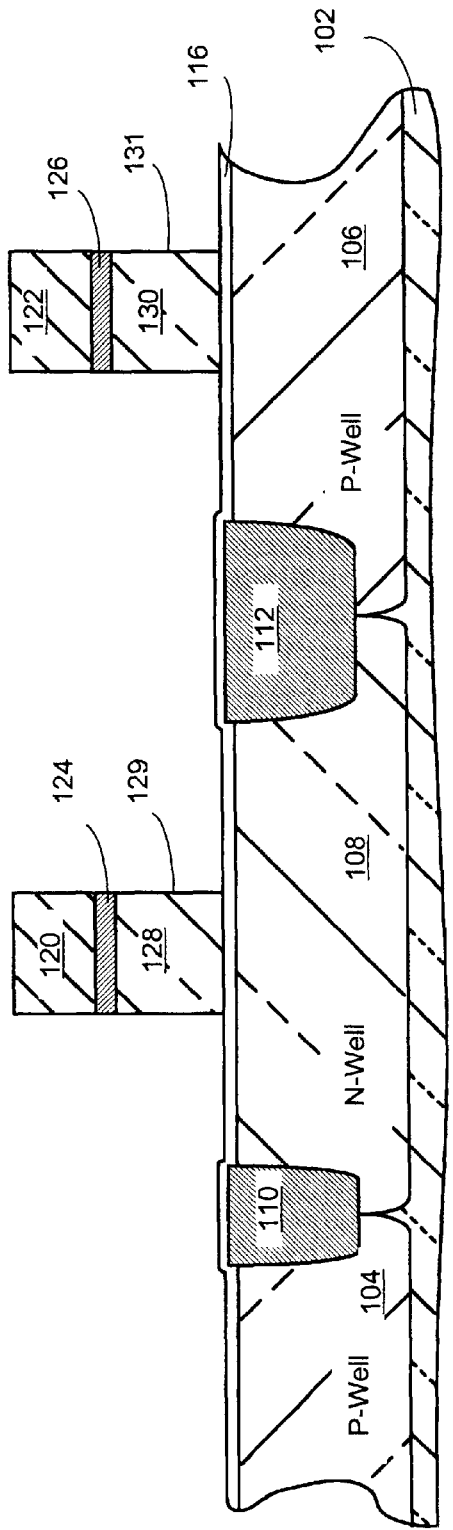
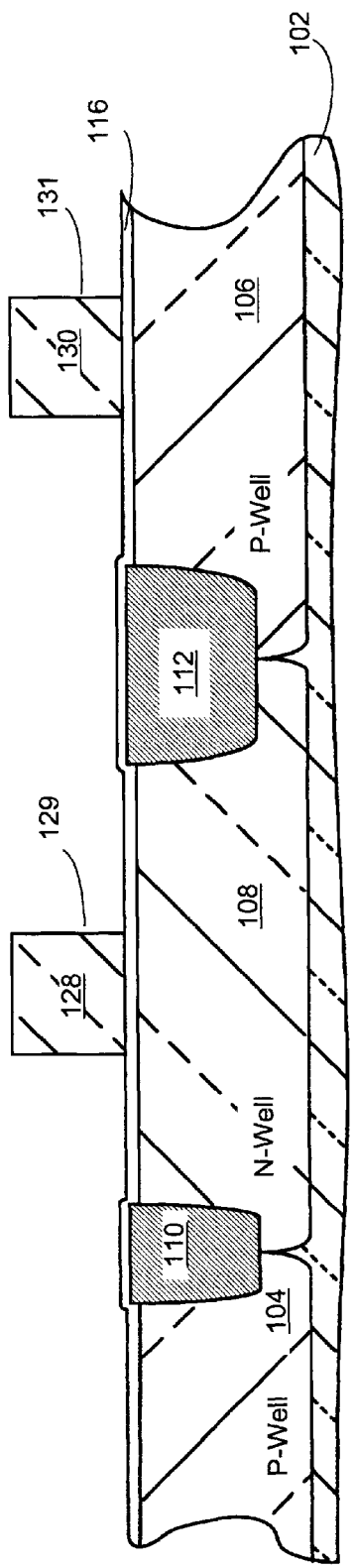
FIG. 1C (PRIOR ART)
FIG. 1D (PRIOR ART)

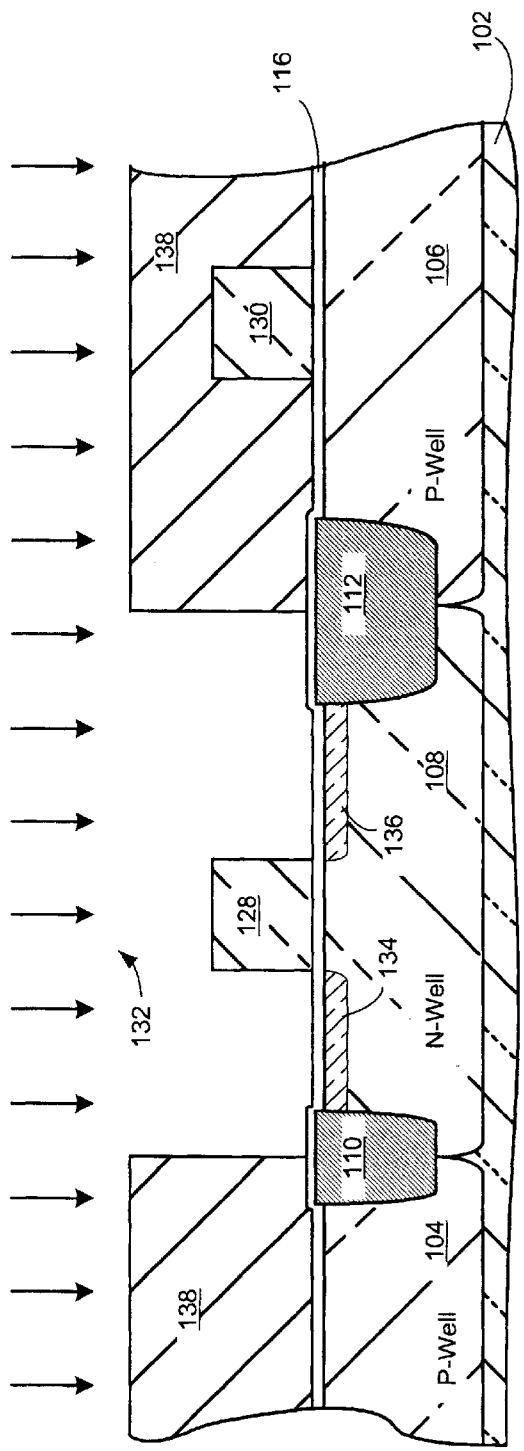
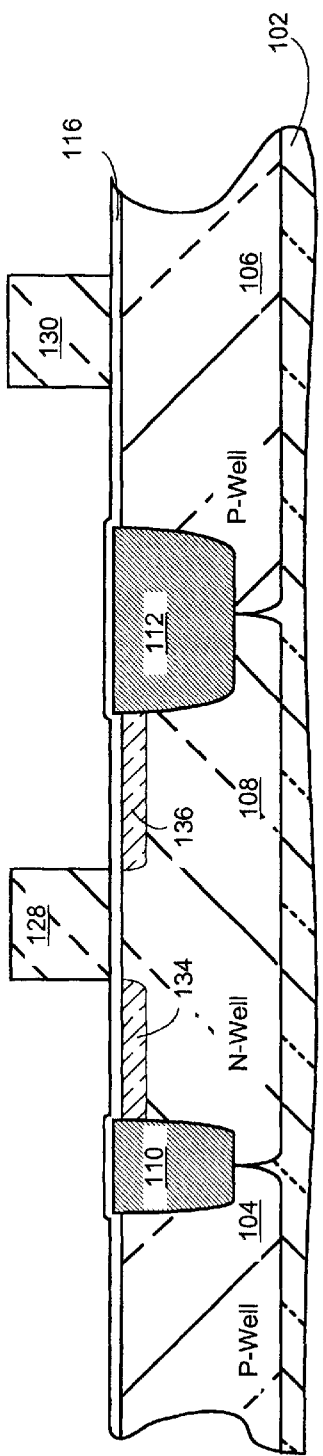
FIG. 1E (PRIOR ART)
FIG. 1F (PRIOR ART)

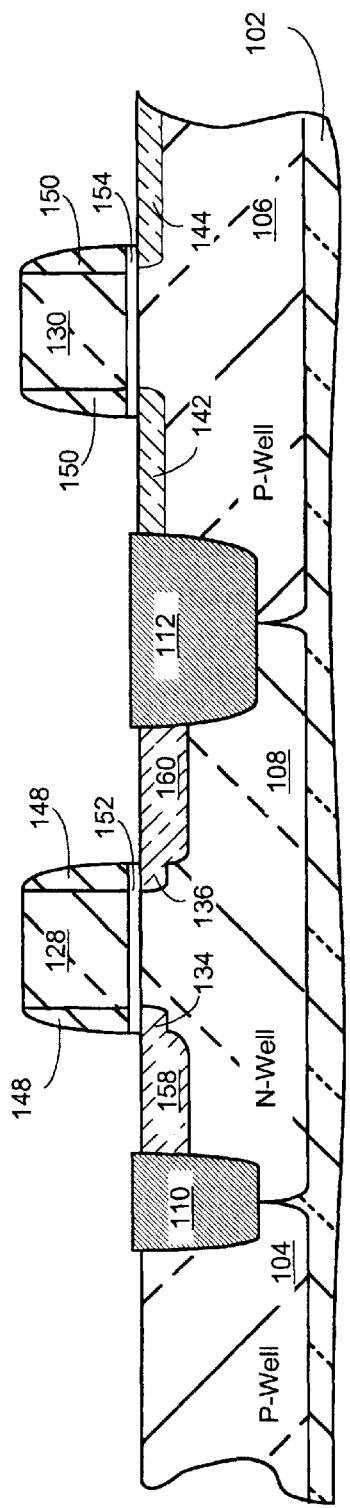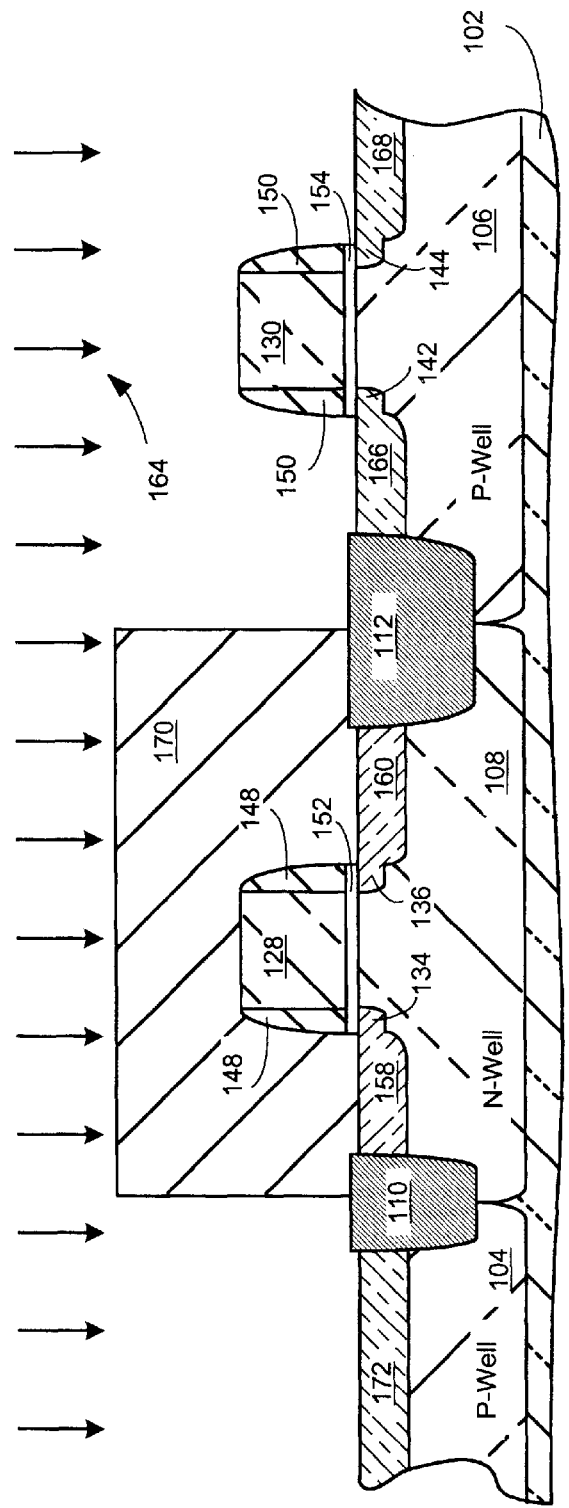
FIG. 1K (PRIOR ART)
FIG. 1L (PRIOR ART)

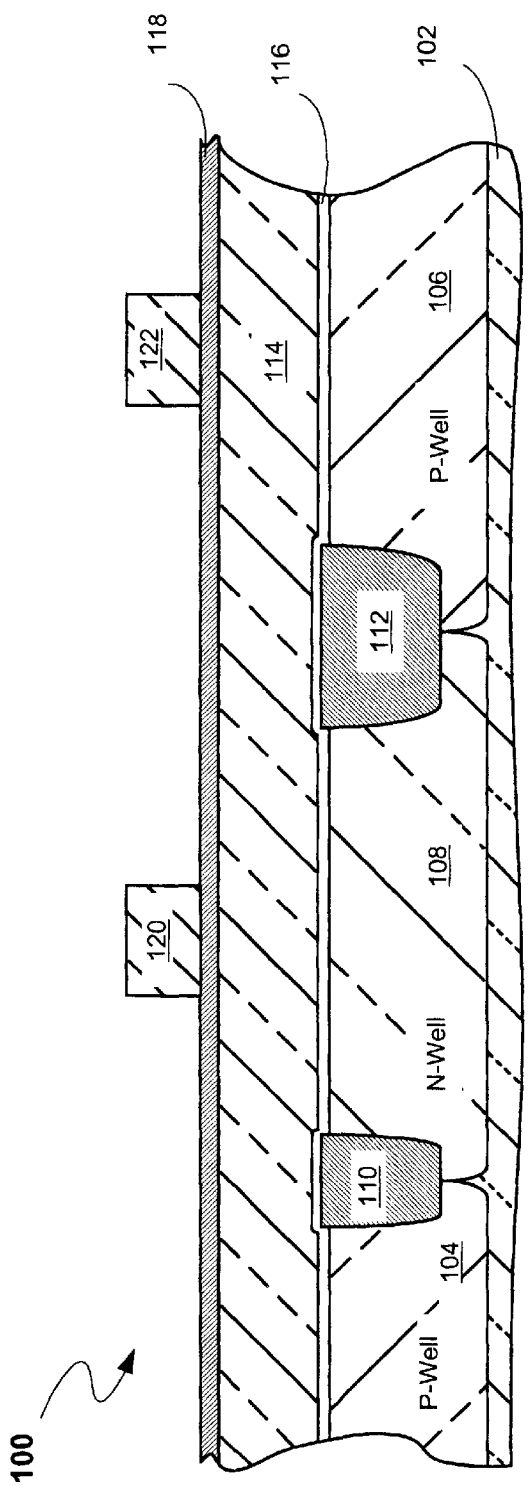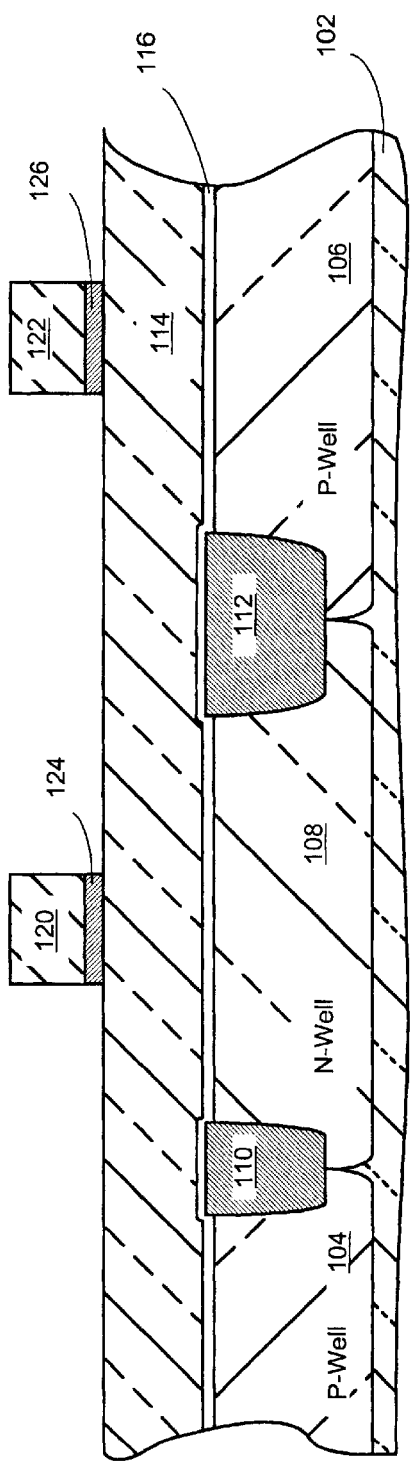

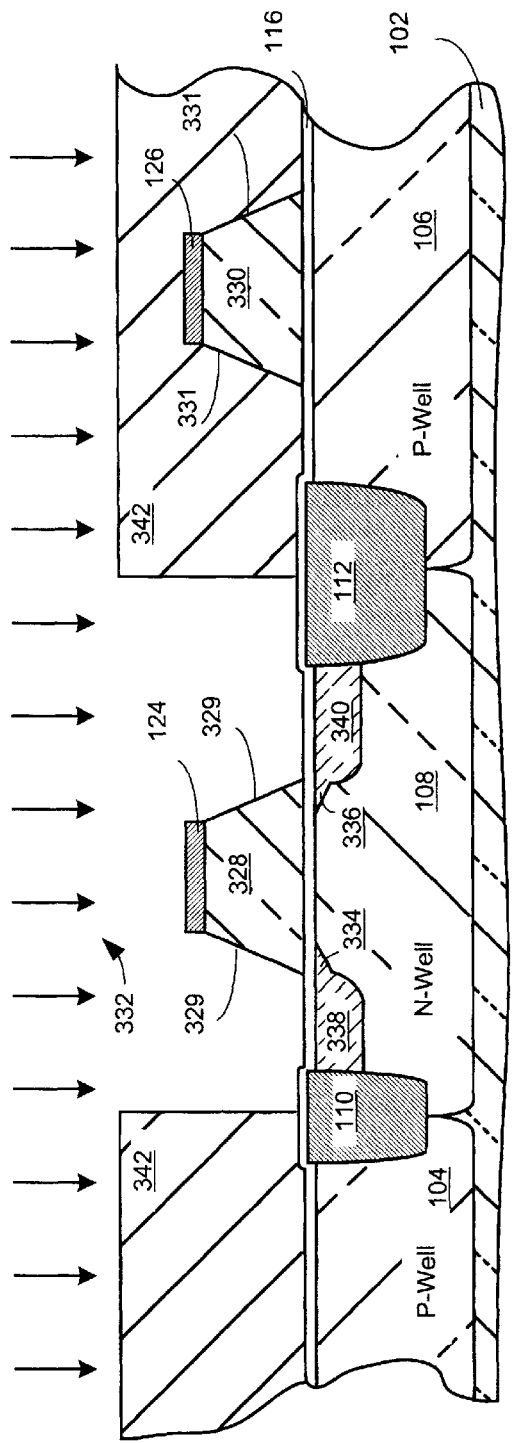
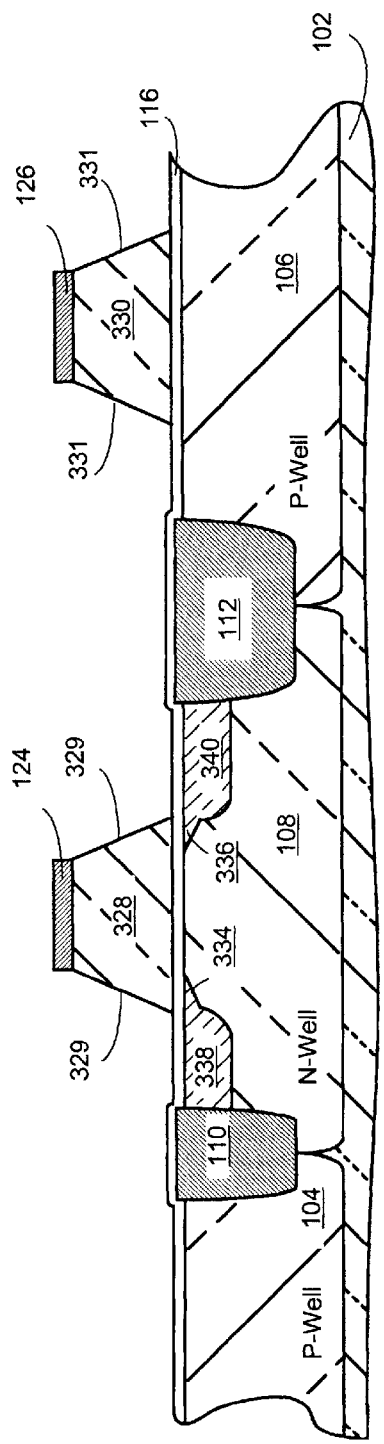
FIG. 3E
FIG. 3F

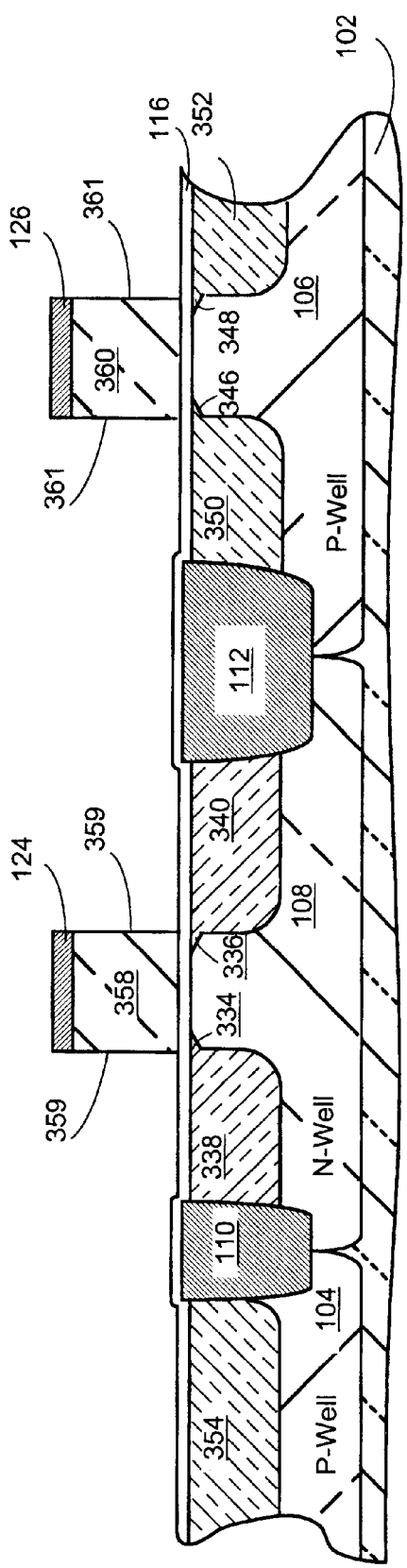
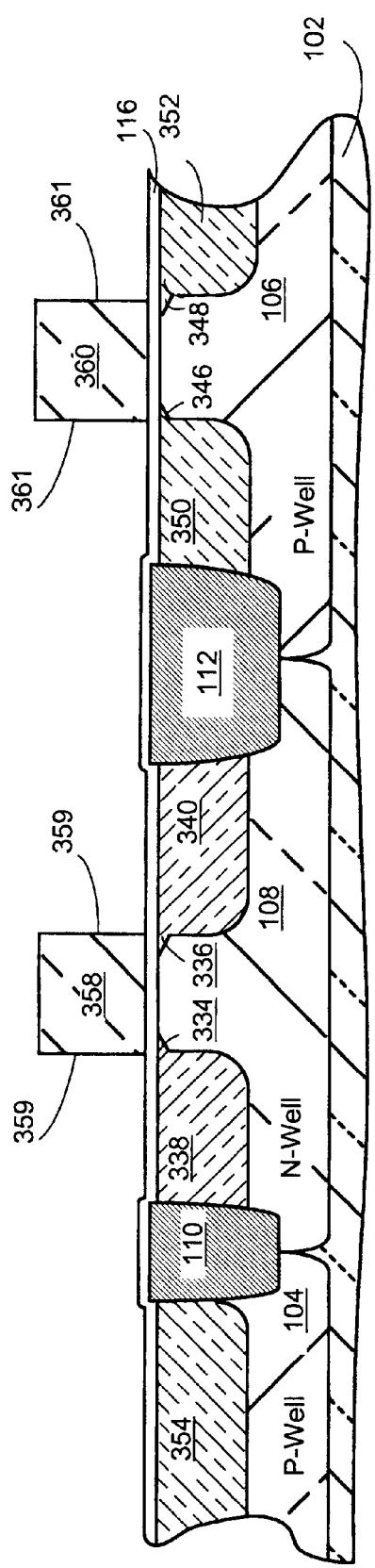
FIG. 3I
FIG. 3J

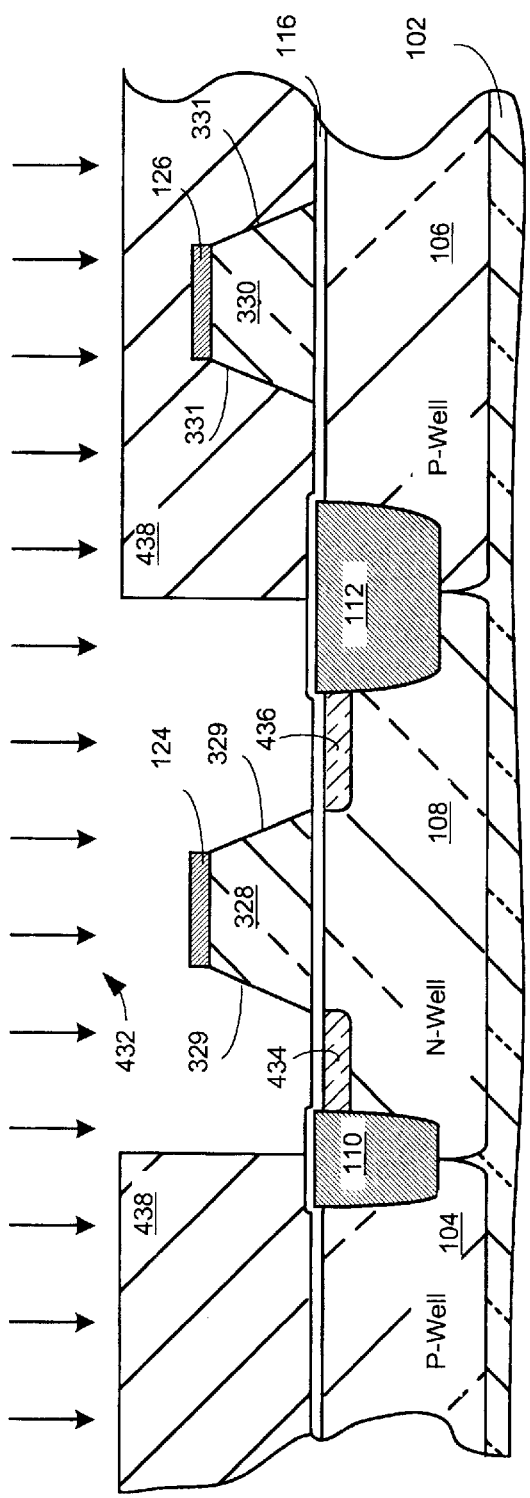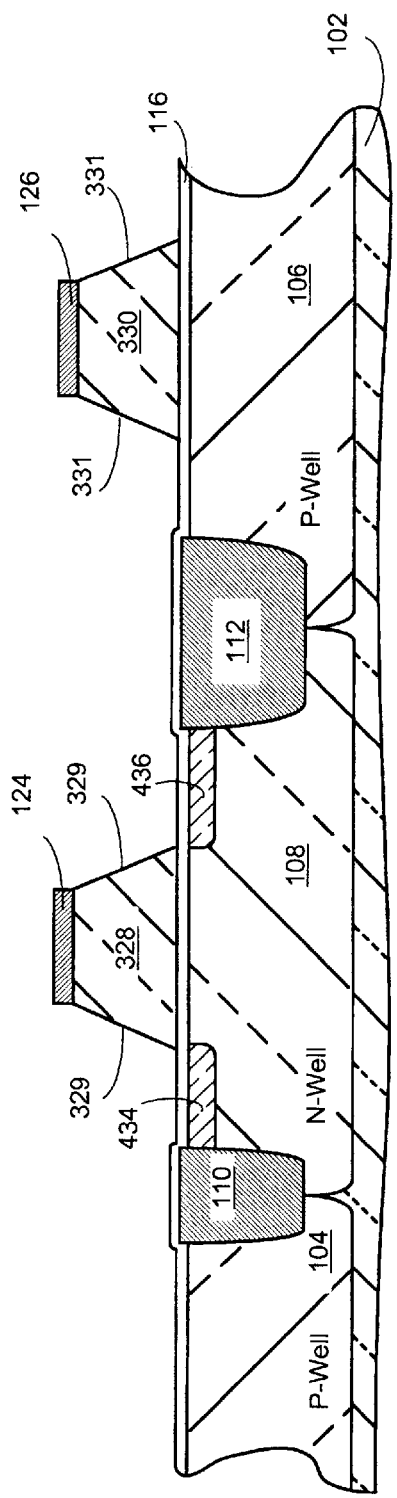

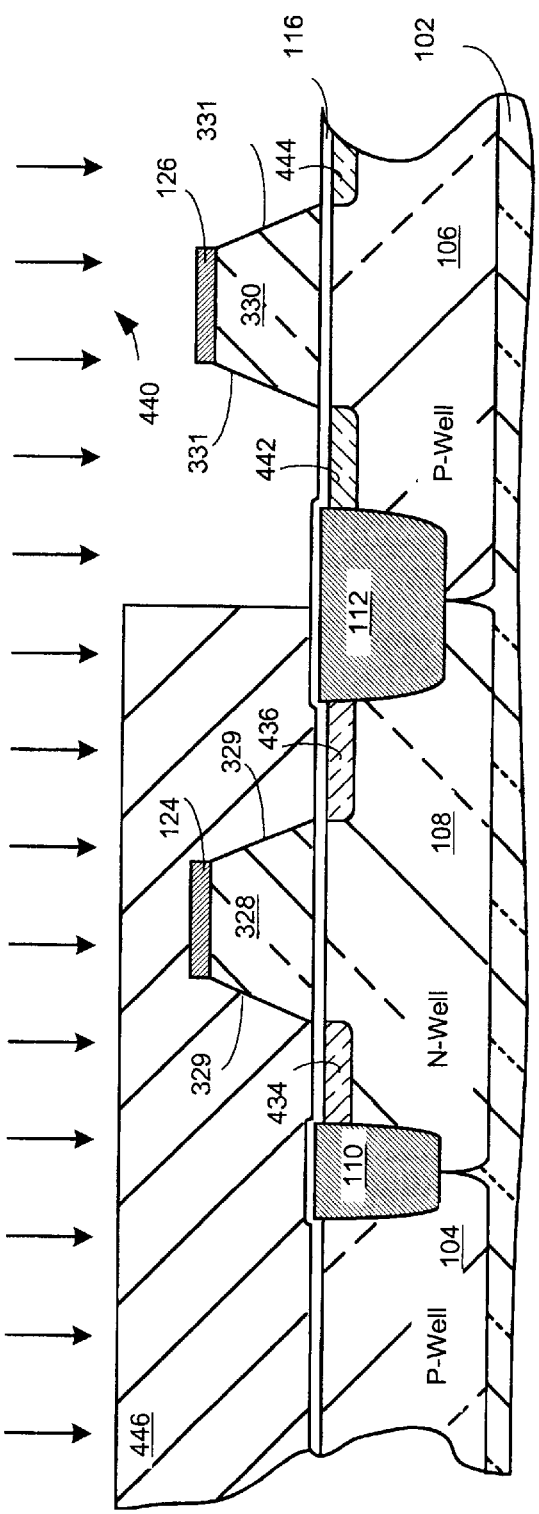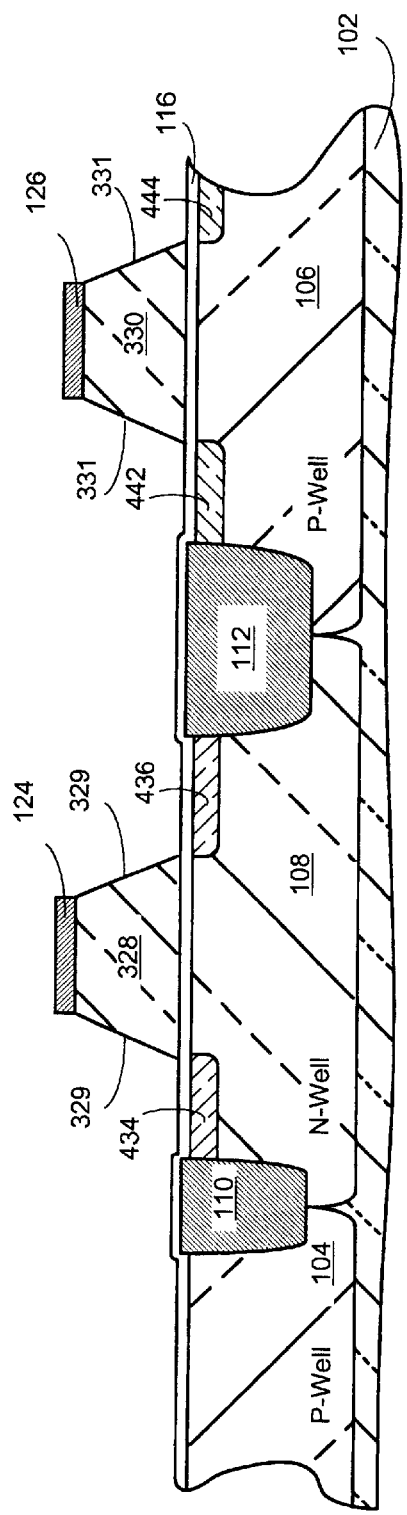
FIG. 4C
FIG. 4D

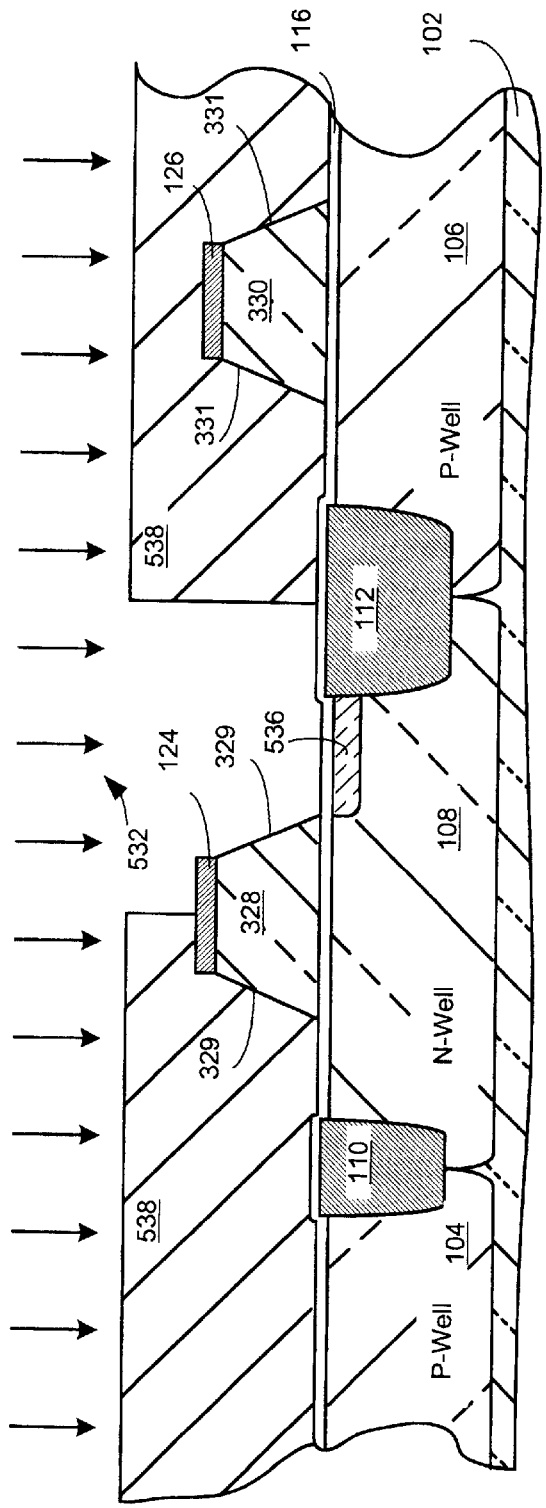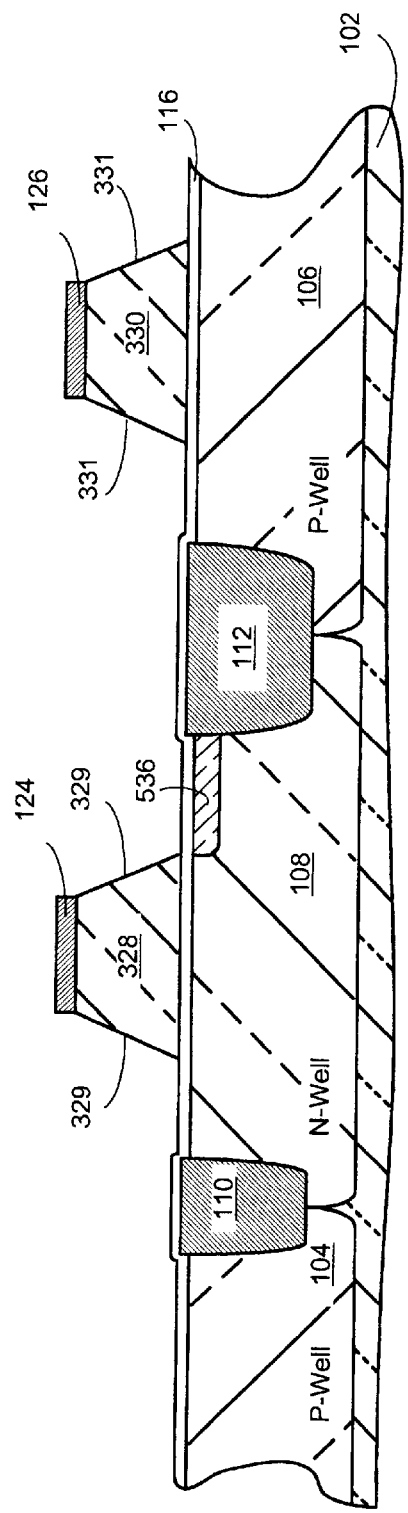

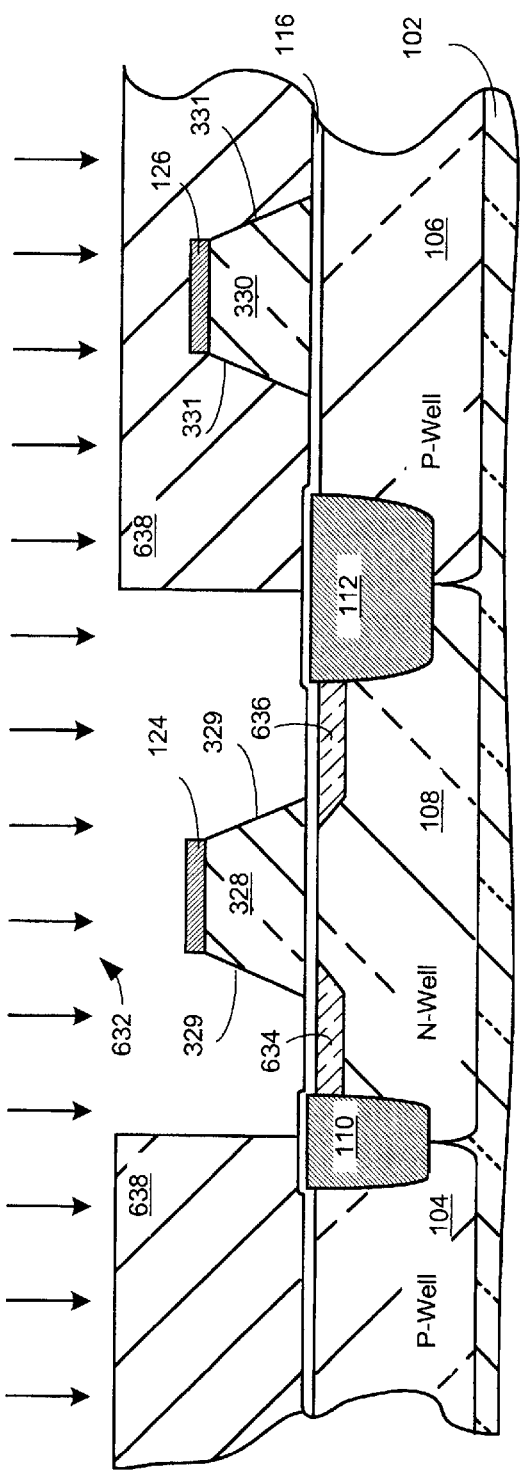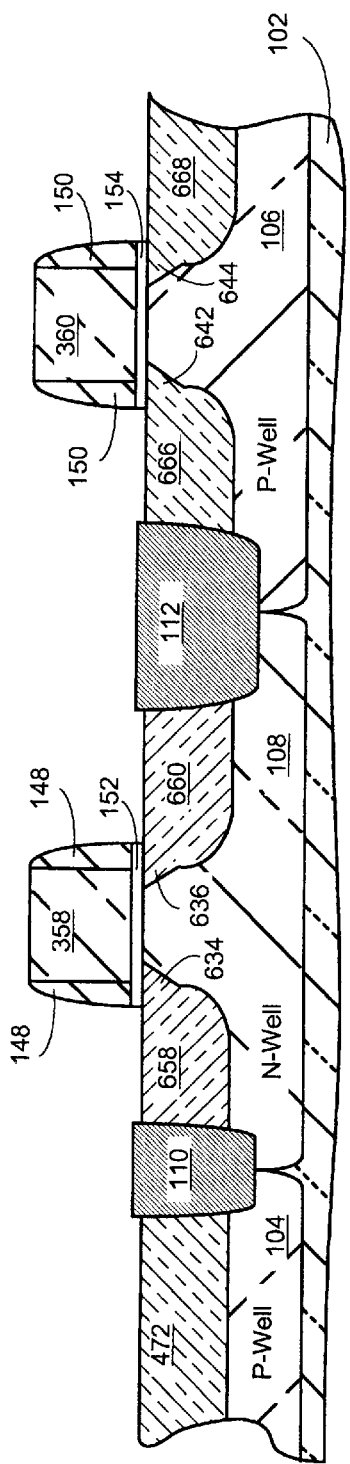
FIG. 6A
FIG. 6B

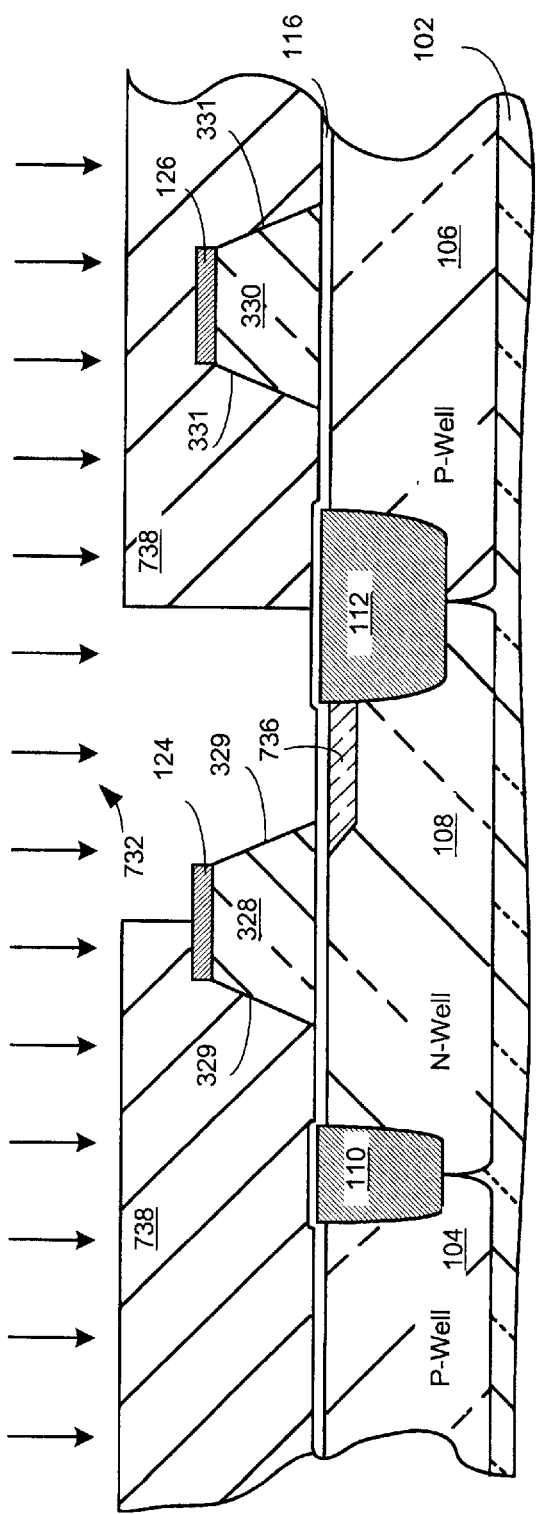
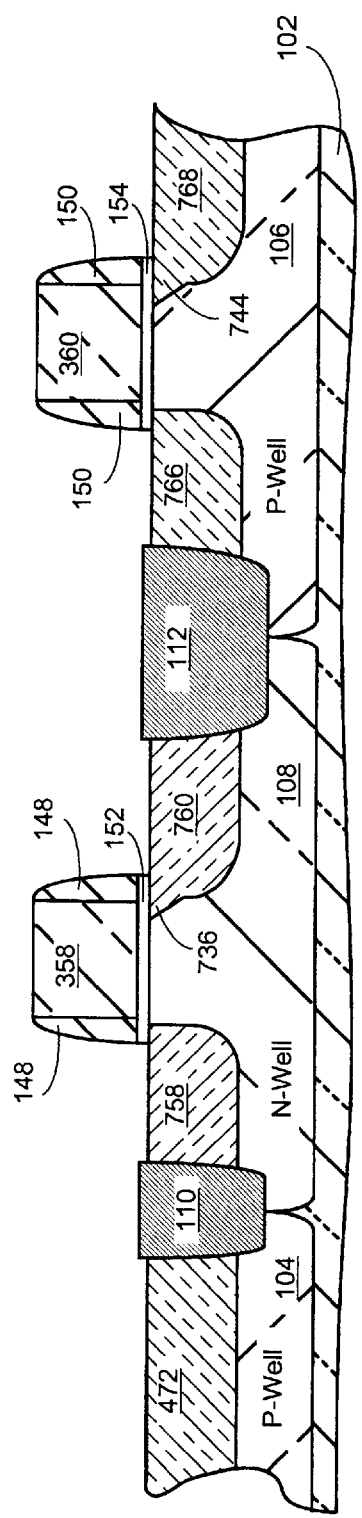
FIG. 7A
FIG. 7B

SIMPLIFIED GRADED LDD TRANSISTOR USING CONTROLLED POLYSILICON GATE PROFILE

CROSS-REFERENCE TO RELATED APPLICATION(S)

This is a divisional of application Ser. No. 09/162,116 filed on Sep. 28, 1998 now U.S. Pat. No. 6,274,443.

TECHNICAL FIELD

The present invention relates generally to manufacturing semiconductors and more specifically to a manufacturing method for Metal-Oxide-Semiconductors (MOS) which employ lightly doped drain (LDD) structures.

BACKGROUND ART

Complementary Metal-Oxide-Semiconductor (CMOS) is the primary technology for ultra large-scale integrated (ULSI) circuits. These ULSI circuits combine two types of Metal-Oxide-Semiconductor (MOS) devices, namely P-channel Metal-Oxide-Semiconductor (PMOS) devices and N-channel Metal-Oxide-Semiconductor (NMOS) devices, on the same integrated circuit. To gain performance advantages, scaling down the size of MOS devices has been the principal focus of the microelectronics industry over the last two decades.

The conventional process of manufacturing MOS devices involves doping a silicon substrate and forming a gate oxide on the substrate followed by a deposition of polysilicon. A photolithographic process is used to etch the polysilicon to form the device gate. As device sizes are scaled down, the gate width, source junctions and drain junctions have to scale down. As the gate width reduces, the channel length between the source and drain is shortened. The shortening in channel length has led to several severe problems.

One of the problems associated with shortened channel length is the so-called "hot carrier effect". As the channel length is shortened, the maximum electric field $E_m$ becomes more isolated near the drain side of the channel causing a saturated condition that increases the maximum energy on the drain side of the MOS device. The high energy causes electrons in the channel region to become "hot". The electron generally becomes hot in the vicinity of the drain edge of the channel where the energy arises. Hot electrons can degrade device performance and cause breakdown of the device. Moreover, the hot electrons can overcome the potential energy barrier between the silicon substrate and the silicon dioxide layer overlying the substrate, which causes hot electrons to be injected into the gate oxide.

Problems arising from hot carrier injections into the gate oxide include generation of a gate current and generation of a positive trapped charge which can permanently increase the threshold voltage of the MOS device. These problems are manifested as an undesirable decrease in saturation current, decrease of the transconductance and a continual reduction in device performance caused by trapped charge accumulation. Thus, hot carrier effects cause unacceptable performance degradation in MOS devices built with conventional drain structures when channel lengths are short.

Reducing the maximum electric field $E_m$ in the drain side of the channel is a popular way to control the hot carrier injections. A common approach to reducing $E_m$ is to minimize the abruptness in voltage changes near the drain side of the channel. Disbursing abrupt voltage changes reduces $E_m$ strength and the harmful hot carrier effects resulting therefrom. Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the channel. The smoother or more gradual the doping profile, the smaller $E_m$ is which results in lesser hot carrier injections.

To try to remedy the problems associated with hot carrier injections, alternative drain structures such as lightly doped drain (LDD) structures have been developed. LDD structures provide a doping gradient at the drain side of the channel that lead to the reduction in $E_m$. The LDD structures act as parasitic resistors to absorb some of the energy into the drain and thus reduce maximum energy in the channel region. This reduction in energy reduces the formation of hot electrons. To further minimize the formation of hot electrons, an improvement in the gradual doping profile is needed.

In most typical LDD structures of MOS devices, sources/drains are formed by two implants with dopants. One implant is self-aligned to the polysilicon gate to form shallow source/drain extension junctions or the lightly doped source/drain regions. Oxide or oxynitride spacers then are formed around the polysilicon gate. With the shallow drain extension junctions protected by the spacers, a second implant with heavier dose is self-aligned to the oxide spacers around the polysilicon gate to form deep source/drain junctions. There would then be a rapid thermal anneal (RTA) for the source/drain junctions to enhance the diffusion of the dopants implanted in the deep source/drain junctions so as to optimize the device performance. The purpose of the first implant is to form a LDD at the edge near the channel. In a LDD structure, almost the entire voltage drop occurs across the lightly doped drain region. The second implant with heavier dose forms low resistance deep drain junctions, which are coupled to the LDD structures. Since the second implant is spaced from the channel by the spacers, the resulting drain junction adjacent to the light doped drain region can be made deeper without impacting device operation. The increase junction depth lowers the sheet resistance and the contact resistance of the drain.

In most typical LDD structures for CMOS devices, sources/drains are formed by four implants with dopants, each implant requiring a masking step. The four masking steps are: a first mask (a P-LDD mask) to form the P-LDD structures, a second mask (an N-LDD mask) to form the N-LDD structures, a third mask (a P+S/D mask) to form the P-type doped, deep source/drain junctions, and a fourth mask (an N+S/D mask) to form the N-type doped, deep source/drain junctions. Each masking step typically includes the sequential steps of preparing the semiconductor substrate, applying a photoresist material, soft-baking, patterning and etching the photoresist to form the respective mask, hard-baking, implanting a desired dose of a dopant with the required conductivity type, stripping the photoresist, and then cleaning of the substrate. These processing steps associated with each masking step adversely increase cycle time and process complexity and also introduce particles and defects, resulting in an undesirable increase in cost and yield loss. Hence, there is a need to provide a method for forming MOS devices and CMOS devices with LDD structures that lessens the number of masking steps required.

Further improvements in transistor reliability and performances for exceeding smaller devices are achieved by a transistor having LDD structures only at the drain region (asymmetric LDD structures). Parasitic resistance due to the LDD structure at the source region of a transistor causes a decrease in drain current as well as a greater power dissipation for a constant supply voltage. The reduction in drain current is due to the effective gate voltage drop from self-biased negative feedback. At the drain region of the transistor, the drain region parasitic resistance does not appreciably affect drain current when the transistor is operating in the saturation region. Therefore, to achieve high-performance MOS transistor operation, it is known to form LDD structures only at the drain regions but not at the source regions.

One significant problem with the LDD structures is the formation of parasitic capacitors. These parasitic capacitors are formed due to the diffusion of dopants from the LDD towards the channel regions underneath the polysilicon gate as a result of RTA and other heating processes in the manufacturing of the transistors. These parasitic capacitors are highly undesirable because they slow down the switching speed of the transistors. The adverse speed impact increases disproportionately with shortened channels. Basically, the parasitic capacitance due to LDD structures as a percentage of the total transistor capacitance is higher for sub-0.18 micron transistors than it is for a 0.18 micron transistor and even worse for a sub-0.13 transistor, making the adverse speed impact much more significant in smaller transistors.

The conventional approaches to reduce parasitic capacitance have been to reduce LDD implant dosage or scaling down the operating voltage. However, these approaches also degrade the performance of the transistors.

Methods to minimize the formation of hot carriers by improving the gradual doping profile in LDD structures, to simplify the process for forming LDD structures by lessening the number of masking steps, and to reduce the parasitic capacitance due to LDD structures without comprising transistor performance have long been sought but have eluded those skilled in the art.

DISCLOSURE OF THE INVENTION

The present invention provides a method of manufacturing semiconductors having reduced parasitic capacitance.

The present invention further provides a method of manufacturing semiconductors having LDD structures in which process complexity is minimized by reducing the number of masking steps.

The present invention also provides a method of manufacturing semiconductors with LDD structures having reduced parasitic capacitance and graded doping profiles which reduces hot carrier injections.

The present invention additionally provides a method of manufacturing semiconductors using a single-step ion implantation to form both LDD structures and the deep source/drain regions of a transistor device.

The above and additional advantages of the present invention will become apparent to those skilled in the art from a reading of the following detailed description when taken in conjunction with the accompanying drawings.

BRIEF DESCRIPTION OF THE DRAWINGS

FIGS. 4A through 4F illustrate the sequence of process steps of another LDD process in accordance with the present invention that, when used in combination with the steps of FIGS. 3A through 3D, FIGS. 1I through 1L, and FIGS. 1N through 1S, form CMOS transistors with LDD structures in the source and drain regions and an ESD resistor;

FIGS. 5A through 5F illustrate the sequence of process steps of a True-LDD process in accordance with the present invention that, when used in combination with the steps of FIGS. 3A through 3D, FIGS. 1I through 1L, and FIGS. 1N through 1S, form CMOS transistors with LDD structures only in the drain regions and an ESD resistor;

FIGS. 6A through 6B illustrate the sequence of process steps of another LDD process in accordance with the present invention that, when used in combination with the steps of FIGS. 3A through 3D, FIGS. 1G through 1L, and FIGS. 1N through 1S, form CMOS transistors with LDD structures in the source and drain regions and an ESD resistor; and FIGS. 7A through 7B illustrate the sequence of process steps of a True-LDD process in accordance with the present invention that, when used in combination with the steps of FIGS. 3A through 3D, FIGS. 1G through 1L, and FIGS. 1N through 1S, form CMOS transistors with LDD structures only in the drain regions and an ESD resistor.

BEST MODE FOR CARRYING OUT THE INVENTION

Figure 1G:
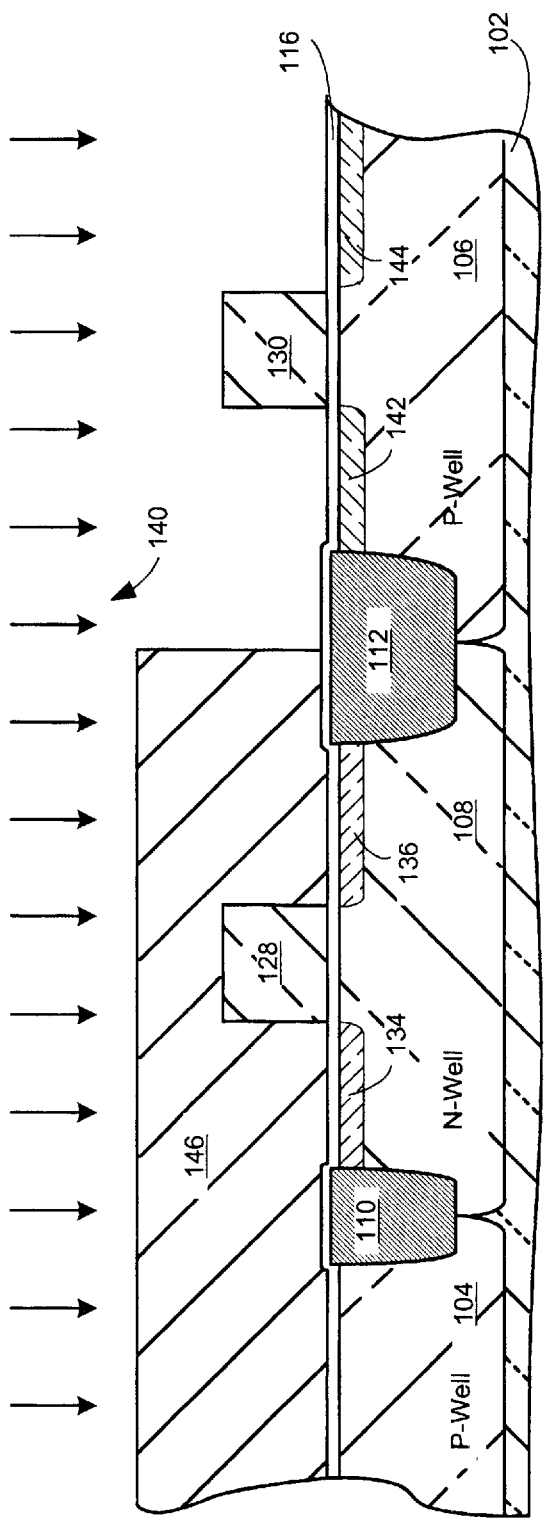
FIGS. 1A through 1S (PRIOR ART) illustrate the sequence of process steps of a conventional LDD process for fabricating CMOS transistors with LDD structures in the source and drain regions, and a resistor for use with electrostatic discharge protection circuits (an ESD resistor)
Figure 1H:
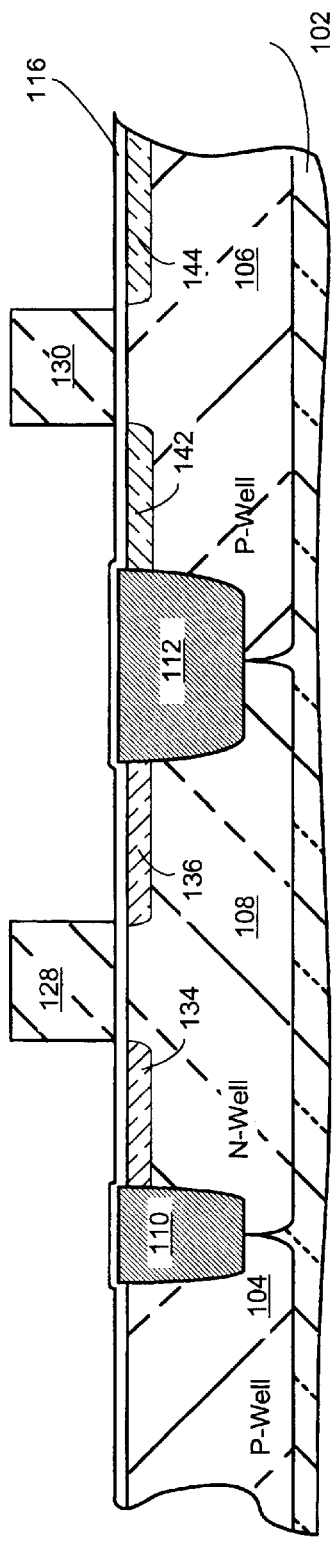
Figure 1I:
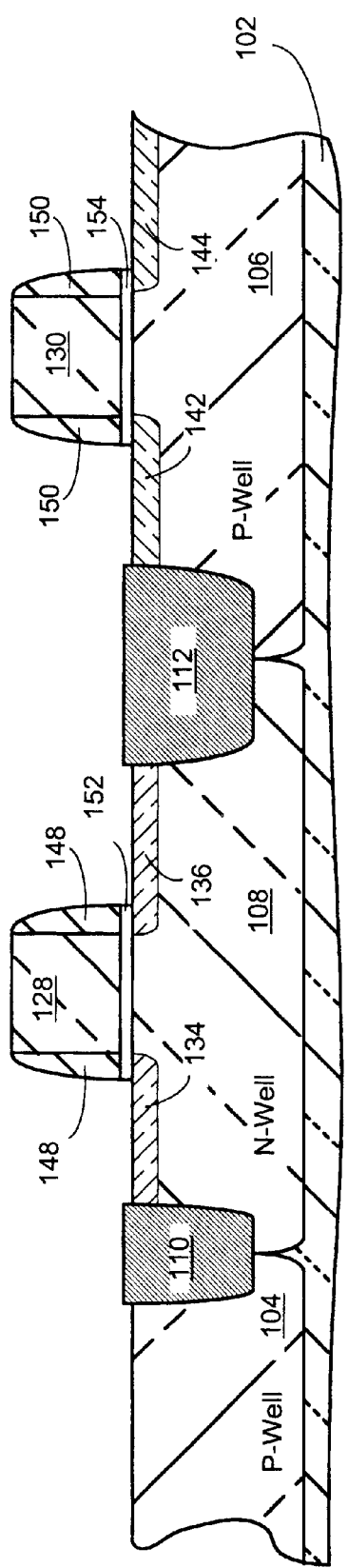
Figure 1J:
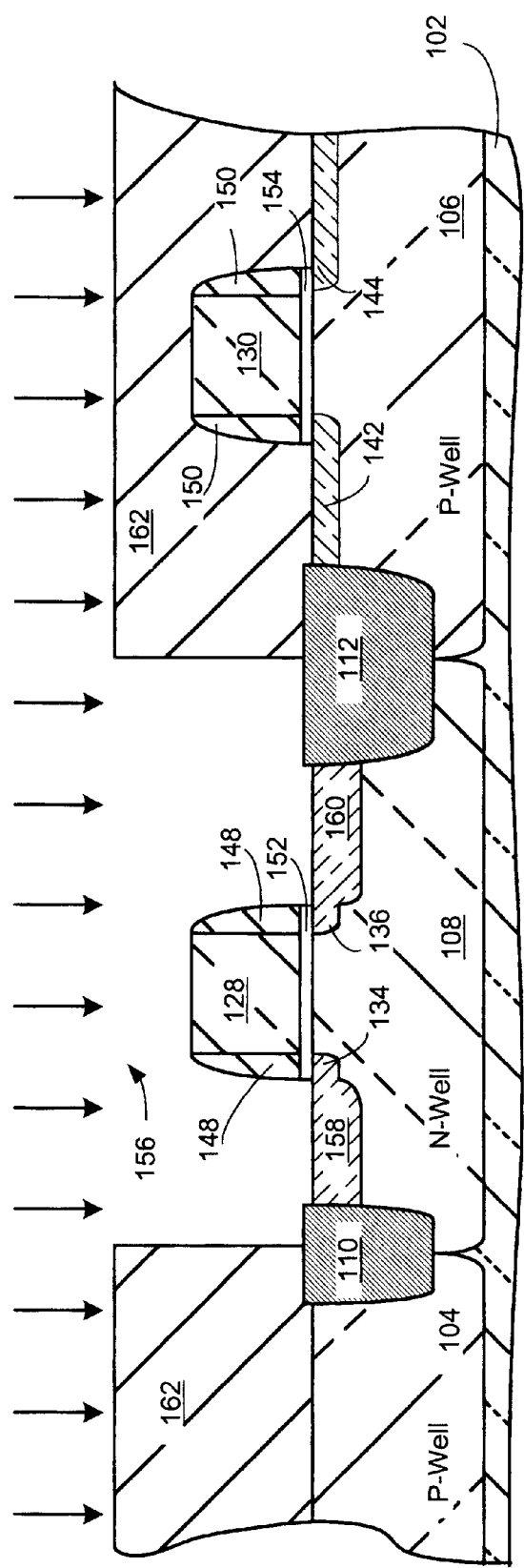
Figure 1M:
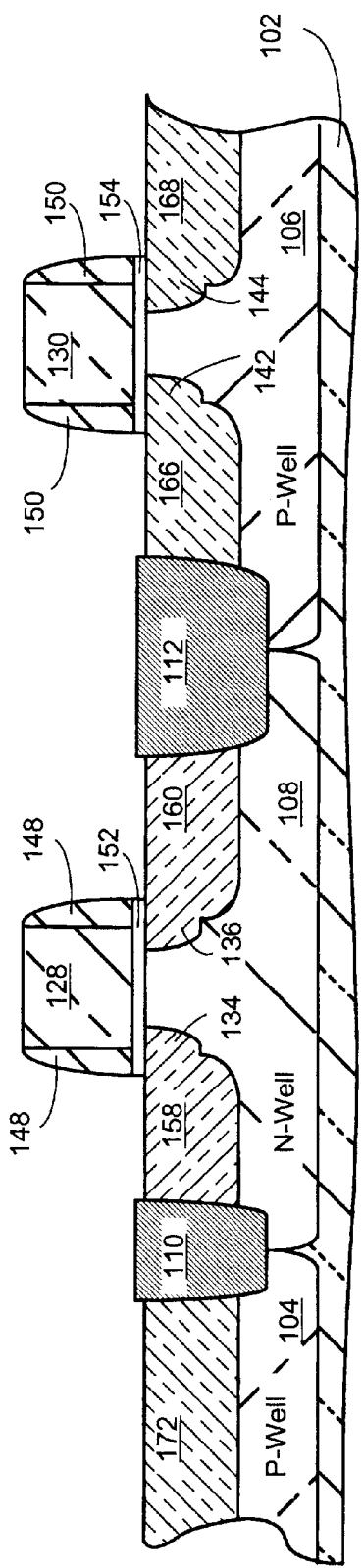
Figure 1N:
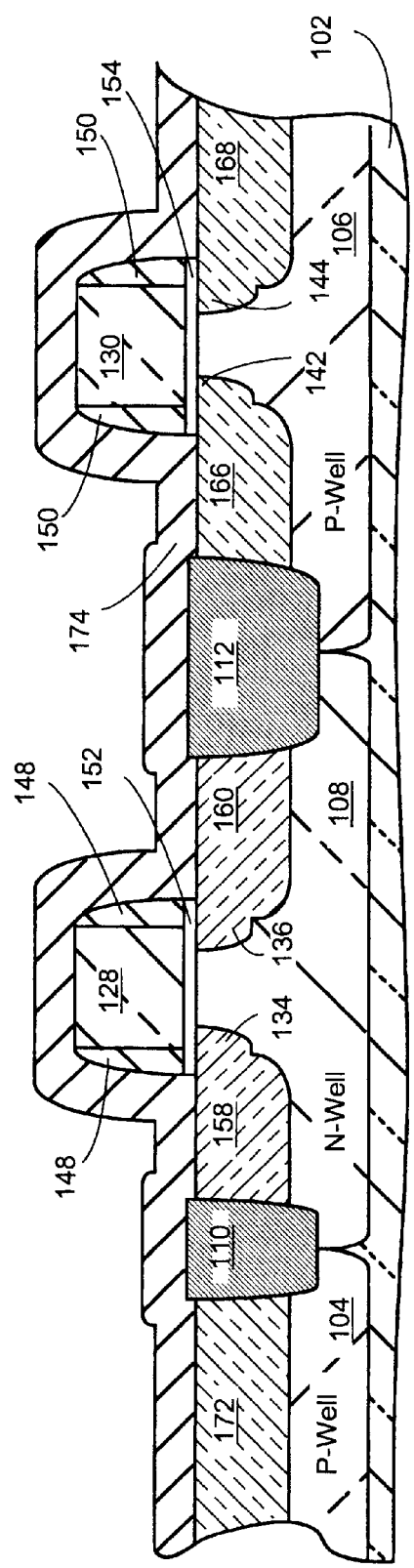
Figure 1O:
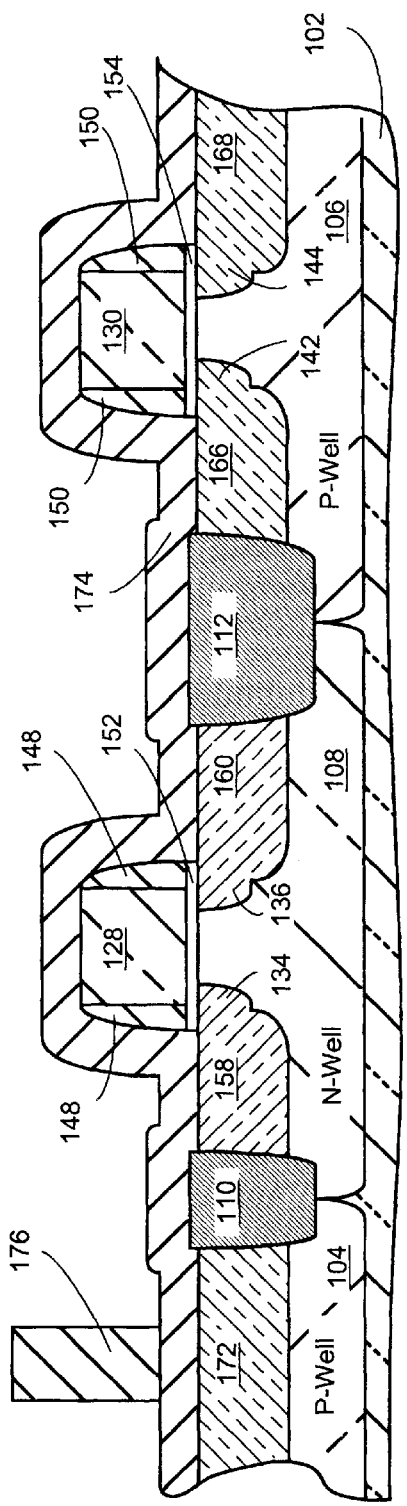
Figure 1P:
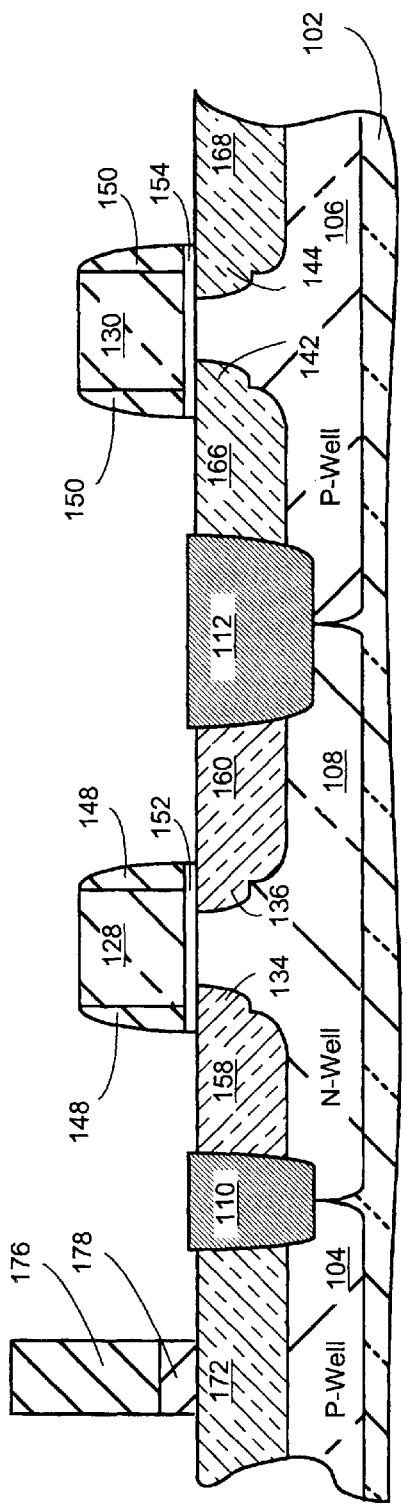
Figure 1Q:
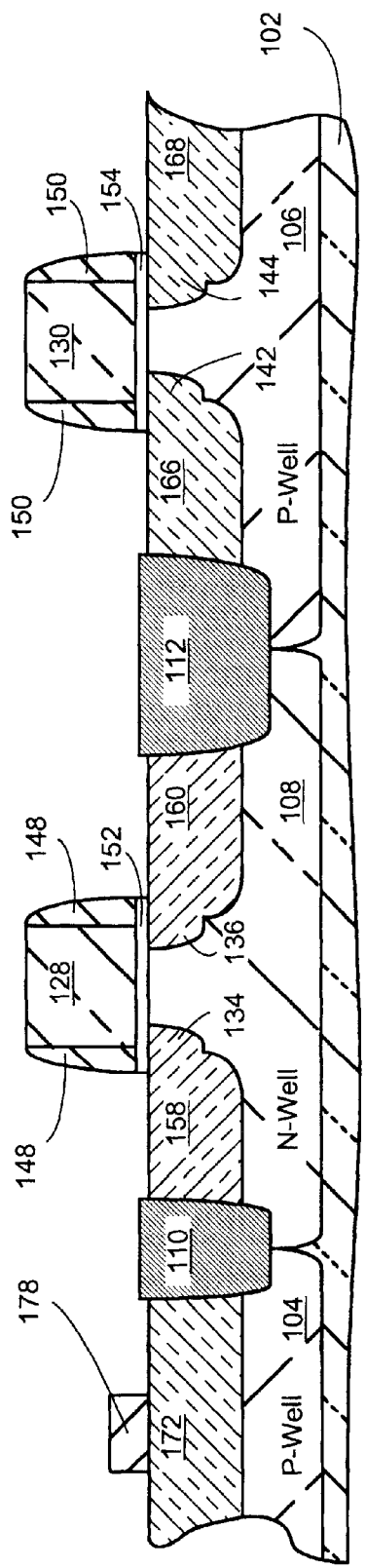
Figure 1R:
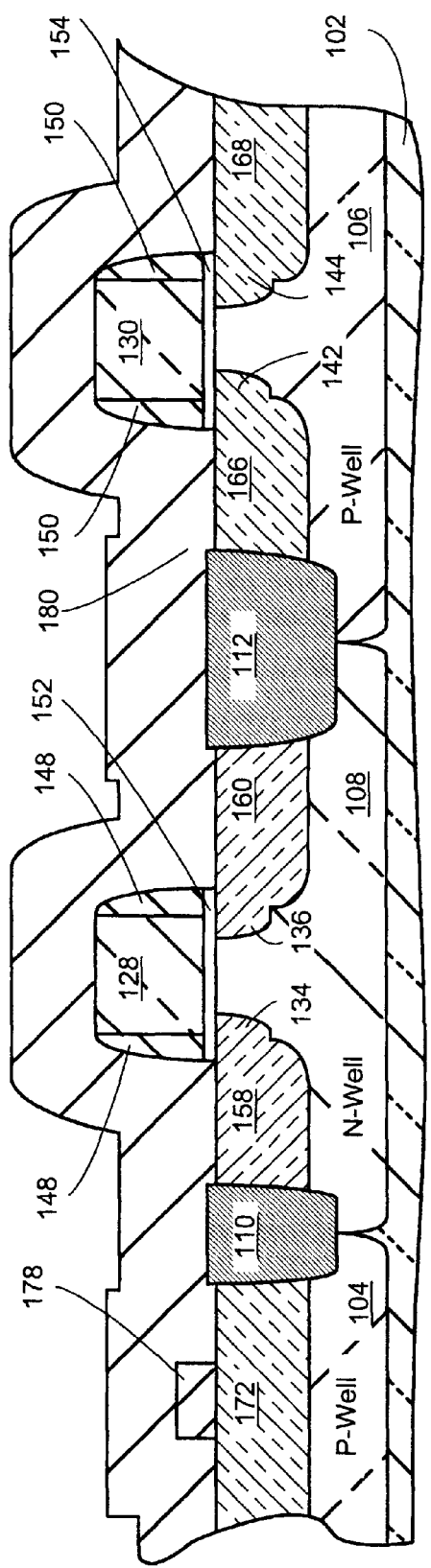
Figure 1S:
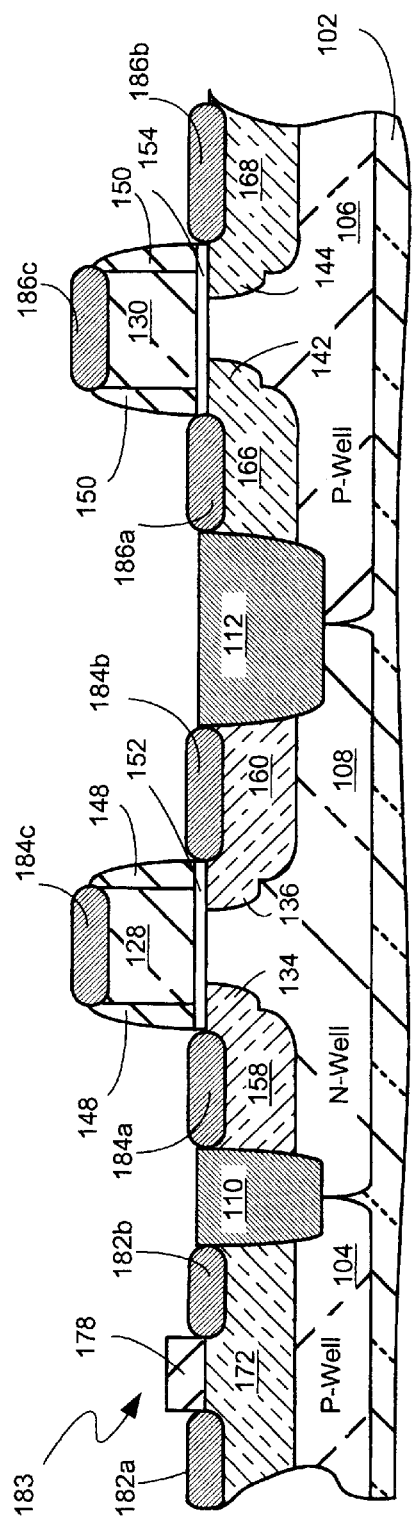

FIGS. 1A through 1S (PRIOR ART) illustrate a conventional LDD process for fabricating CMOS transistors with LDD structures in the source and drain regions, and an ESD resistor.

Referring now to FIG. 1A (PRIOR ART), therein is shown a cross-section of a semiconductor 100 in an intermediate stage of processing. At this stage are shown a silicon substrate 102 with two spaced P-well regions 104 and 106, and an N-well region 108 formed thereon. The P-well regions 104 and 106 have been doped with a P-type dopant which is one of the Group III elements such as boron, and gallium, with boron (B) or boron difluoride (BF2) being the most commonly used. The N-well region 108 has been doped with an N-type dopant which is one of the Group V elements such as phosphorus, arsenic, and antimony with phosphorous being the most commonly used. An ESD resistor will be formed on the P-well region 104. An N-channel device and a P-channel device will be formed on the P-well region 106 and N-well region 108 respectively.

Conventional shallow trench isolation (STI) 110 is to be formed between the P-well region 104 and the N-well region 108, and STI 112 is to be formed between the N-well region 108 and the P-well region 106. STI 110 electrically isolates devices to be formed on the P-well region 104 and N-well region 108. Similarly, STI 112 electrically isolates devices to be formed on the P-well region 106 and the N-well region 108. The materials that have been used for STI have included various oxides. On top of the silicon substrate 102 is a polysilicon layer 114 and a layer of gate oxide 116 disposed between the silicon substrate 102 and the polysilicon layer 114.

On top of the polysilicon layer is a first mask layer 118. The first mask layer 118 is typically an anti-reflective coating (ARC) for enhancing the imaging effect in subsequent photolithography processing. The materials that have been used for ARC have included various oxides and nitrides. One of the most commonly used ARC is silicon oxynitride. On top of the ARC 118 are patterned second masks 120 and 122 which are typically of a photoresist material. The second masks 120 and 122 are conventionally formed by patterning and etching a second mask layer (not shown).

It should noted that the term "region" is used herein and applies to areas after or subject to implantation since there is a tapering decrease or increase of atoms of a given dopant in the region designated rather than sharp demarcations as apparently indicated by the lines shown. Referring now to FIG. 1B (PRIOR ART), therein is shown the silicon substrate 102 after the conventional step of ARC etch to form patterned ARC mask 124 and 126.

Referring now to FIG. 1C (PRIOR ART), therein is shown the silicon substrate 102 after the conventional step of polysilicon gate etch which forms two spaced polysilicon gates 128 and 130. Each of the polysilicon gates 128 and 130 has sidewalls 129 and 131 respectively. Each sidewall 129 and 131 has a substantially vertical profile.

Referring now to FIG. 1D (PRIOR ART), therein is shown the silicon substrate 102 after the conventional steps of photoresist stripping and ARC removal.

Referring now to FIG. 1E (PRIOR ART), therein is shown the ion implantation 132 of a P-type dopant through the thin gate oxide 116 to form the P-type doped, LDD regions or shallow source and drain extension junctions 134 and 136. The ion implantation 132 is a low energy, low concentration P− implant using, for example, $B_{11}$. It should be noted that "source" and "drain" may be used interchangeably since they are the same for all purposes until connected in a circuit. A conventional photolithographic masking process using a patterned photoresist 138 (a P-LDD mask) is used to prevent ion implantation 132 of the P-well regions 104 and 106.

Referring now to FIG. 1F (PRIOR ART), therein is shown the removal of photoresist 138.

Referring now to FIG. 1G (PRIOR ART), therein is shown the ion implantation 140 of an N-type dopant through the thin gate oxide 116 to form the N-type doped, LDD regions or shallow source and drain extension junctions 142 and 144. The ion implantation 140 is a low energy, low concentration N− implant using, for example, phosphorus. Again, a conventional photolithographic masking process using a photoresist 146 (an N-LDD mask) is used to prevent ion implantation 140 of the P-well region 104 and N-well region 108.

Referring now to FIG. 1H (PRIOR ART), therein is shown the removal of photoresist 146.

Referring now to FIG. 1I (PRIOR ART), therein are shown sidewall spacers 148 and 150 formed around the polysilicon gates 128 and 130. The sidewall spacers 148 and 150 can be formed using conventional techniques such as by depositing a spacer film over the gate oxide layer 116 and the polysilicon gates 128 and 130, and then anisotropically etching the spacer film. At this stage, except for the gate oxides 152 and 154 which are located directly underneath the polysilicon gates 128 and 130, and sidewall spacers 148 and 150, gate oxides in other areas of the substrate 102 have been removed.

Referring now to FIG. 1J (PRIOR ART), therein is shown the ion implantation 156 of a P-type dopant through the sidewall spacer 148 to form the P-type doped, deep source and drain junctions 158 and 160. The ion implantation 156 is a high energy, high concentration P+ implant using, for example, $BF_2$. The sidewall spacer 148 shields the shallow source and drain extension junction 134 and 136 from ion implantation 156. Again, a conventional photolithographic masking process using a photoresist 162 (a P+S/D mask) is used to prevent ion implantation 156 of the P-well regions 104 and 106.

Referring now to FIG. 1K (PRIOR ART), therein is shown the removal of photoresist 162.

Referring now to FIG. 1L (PRIOR ART), therein is shown the ion implantation 164 of a N-type dopant through the sidewall spacer 150 to form the N-type doped, deep source and drain junctions 166 and 168. The ion implantation 164 is a high energy, high concentration N+ implant using, for example, phosphorus. The sidewall spacer 150 shields the shallow source and drain extension junctions 142 and 144 from ion implantation 164. The ion implantation 164 also forms an N-type doped, resistor region 172 in the P-well region 104. Again, a conventional photolithographic masking process using a photoresist 170 (an N+S/D mask) is used to prevent ion implantation 164 of the N-well regions 104.

Referring now to FIG. 1M (PRIOR ART), therein is shown the rapid thermal anneal (RTA) of the N-type doped, resistor region 172, the P-type doped, shallow source and drain extension junctions 134 and 136, the P-type doped, deep source and drain junctions 158 and 160, the N-typed doped, shallow source and drain extension junctions 142 and 144, the N-type doped, deep source and drain junctions 166 and 168. The transient enhanced diffusion (TED) caused by the RTA inherently increases the displacement of the P-type doped, shallow source and drain extension junctions 134 and 136 and the N-type doped, shallow source and drain extension junctions 142 and 144 into their respective channel regions. The P-type doped, shallow source and drain extension junctions 134 and 136, and the N-typed doped, shallow source and drain extension junctions 142 and 144 provide the resistance needed to suppress hot electrons. However, the overlap portion between the P-type doped, shallow source junction extension 134 (or 136), the gate oxide 152, and the polysilicon gate 128 forms a parasitic capacitor. Similarly, the overlap portion between the N-type doped, shallow source junction extension 142 (or 144), the gate oxide 154, and the polysilicon gate 130 forms another parasitic capacitor. The more the overlap, the higher is the capacitance of the parasitic capacitor. As explained in the Background Art, parasitic capacitors are highly undesirable because they slow down the switching speed of the transistor. The adverse speed impact increases disproportionately with shortened channels. Thus, it is desirable to reduce the overlap portion.

Referring to FIG. 1N (PRIOR ART), therein is shown the deposition of a resistor protect film 174 over the entire surface of the silicon substrate 102.

Referring to FIG. 1O (PRIOR ART), therein is shown the deposition of a resistor protect mask 176 to mask a portion of the N-type doped, resistor region 172.

Referring to FIG. 1P (PRIOR ART), therein is shown the removal of the unmasked portion of the resistor protect film 174 on the silicon substrate to form a resistor isolation 178 on the N-type doped, resistor region 172.

Referring to FIG. 1Q (PRIOR ART), therein is shown the removal of the resistor protect mask 176.

Referring to FIG. 1R (PRIOR ART), therein is shown the deposition of a conductive or metallic layer 180 over the entire surface of silicon substrate 102. The metallic layer is typically titanium (Ti), cobalt (Co), or nickel (Ni).

Referring to FIG. 1S (PRIOR ART), therein is shown the thermal annealing of the silicon substrate 102 to form metallic salicide in the areas where the metallic layer 180 contacts exposed doped regions or polysilicon gates. Accordingly, metallic salicide regions 182a and 182b are formed in the N-type doped, resistor region 172. The N-type doped, resistor region 172, the metallic salicide regions 182a and 182b, and the resistor isolation 178 form the ESD resistor 183. Metallic salicide regions 182a and 182b are the electrodes of ESD resistor 183. Metallic salicide regions 184a and 184b are formed in the P-type doped, deep source and drain junctions 158 and 160, and metallic salicide region 184c is formed in the polysilicon gate 128. Similarly, metallic regions 186a and 186b are formed in the N-type doped, deep source and drain junctions 166 and 168, and metallic salicide region 186c is formed in the polysilicon gate 130. The formation of a metallic salicide over these regions greatly reduces sheet resistance, thereby improving device performance.

In addition to the problems associated with parasitic capacitance due to the lateral diffusion of the LDD structures, this conventional LDD process utilizes four masking steps to form the LDD regions and the deep source and drain regions (a P-LDD mask, an N-LDD mask, a P+S/D mask, and an N+S/D mask). These masking operations increase fabrication complexity. A fabrication process that reduces fabrication complexity and maintains or improves device performance is sought to reduce fabrication costs. It is also desirable to improve the gradual doping profile to further minimize the formation of hot carrier injections.

FIGS. 2A through 2E (PRIOR ART) illustrate the sequence of process steps of a conventional True-LDD process that when used in combination with the steps of FIGS. 1A through 1D, FIGS. 1I through 1L, and FIGS. 1N through 1S, form CMOS transistors with a single LDD structure in each transistor, and an ESD resistor. For convenience of illustration, like reference numerals are used in FIG. 2A through 2E to denote like elements already described in FIG. 1A through 1S.

Figure 2A:
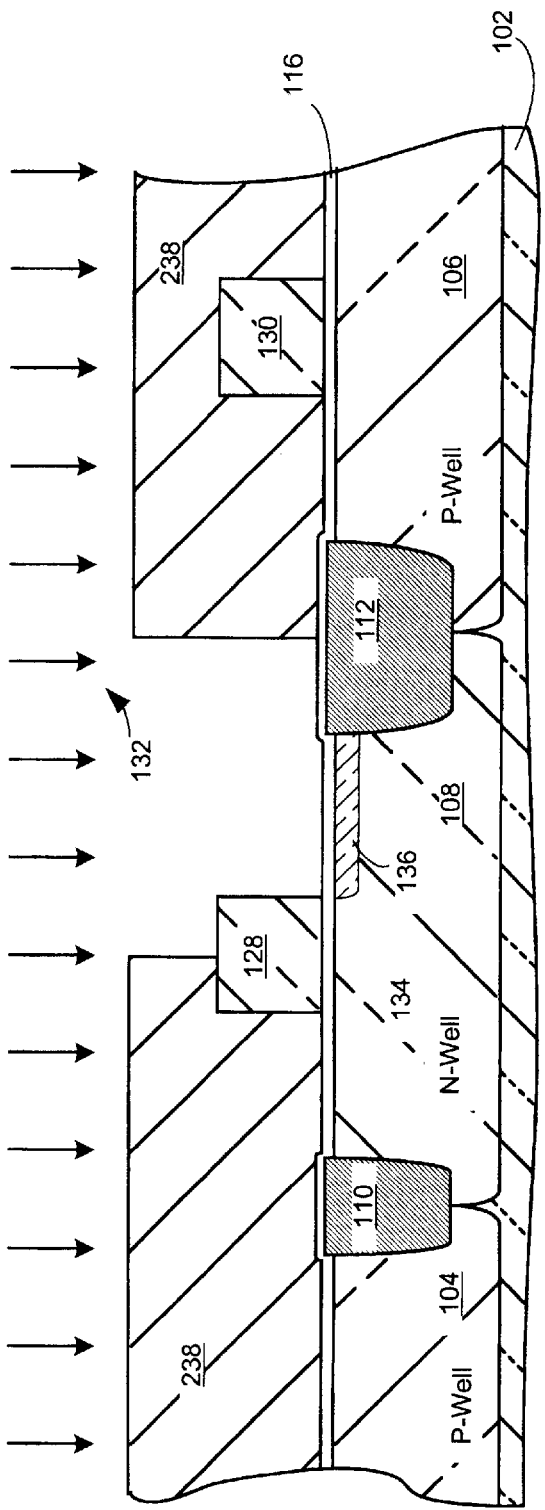
FIGS. 2A through 2E (PRIOR ART) illustrate the sequence of process steps of a conventional True-LDD process that, when used in combination with the steps of FIGS. 1A through 1D, FIGS. 1I through 1L, and FIGS. 1N through 1S, form CMOS transistors with a single LDD structure in each transistor and an ESD resistor.

Referring now to FIG. 2A (PRIOR ART), therein is shown a cross-section of the silicon substrate 102 after it had been processed through the identical steps as illustrated in FIGS. 1A through 1D. At this stage is shown the ion implantation 132 of a dopant through the thin gate oxide 116 to form the P-type doped, LDD region or shallow drain extension junction 136. A conventional photolithographic masking process using a patterned photoresist 238 (a True P-LDD mask) is used to prevent ion implantation 132 of the source region (not shown) yet to be formed adjacent to the polysilicon gate 128 and opposite the shallow drain extension junction 136, and the P-well regions 104 and 106.

Figure 2B:
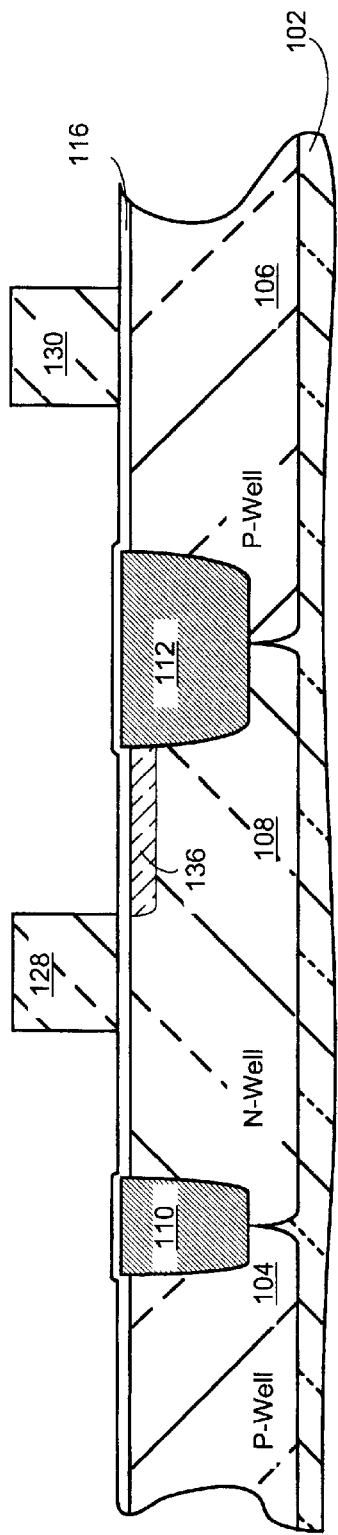

Referring now to FIG. 2B (PRIOR ART), therein is shown the removal of photoresist 238.

Figure 2C:
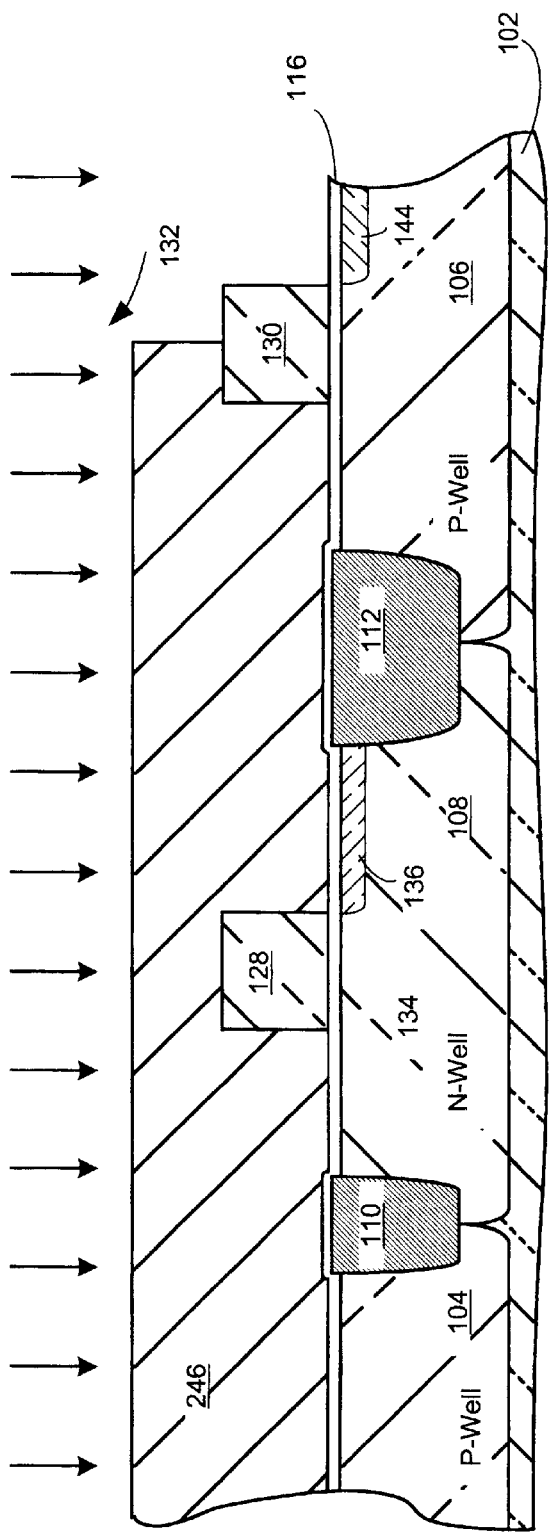

Referring now to FIG. 2C (PRIOR ART), therein is shown the ion implantation 132 of a N-type dopant through the thin gate oxide 116 to form the N-type doped, LDD regions or shallow drain extension junction 144. Again, a conventional photolithographic masking process using a photoresist 246 (a True N-LDD mask) is used to prevent ion implantation 132 of the source region (not shown) yet to be formed adjacent to the polysilicon gate 130 and opposite the shallow drain extension junction 144, P-well region 104 and N-well region 108.

Figure 2D:
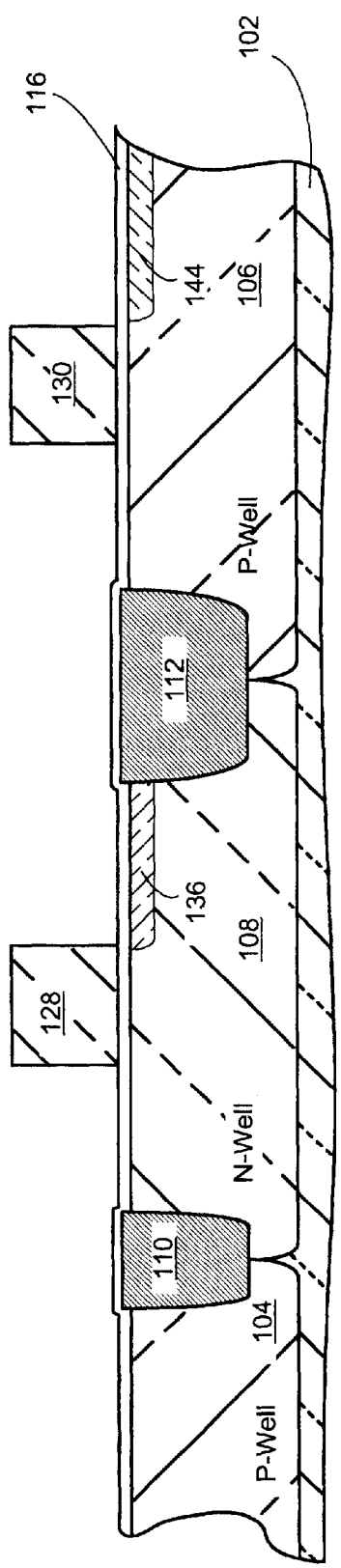

Referring now to FIG. 2D (PRIOR ART), therein is shown the removal of photoresist 246.

Figure 2E:
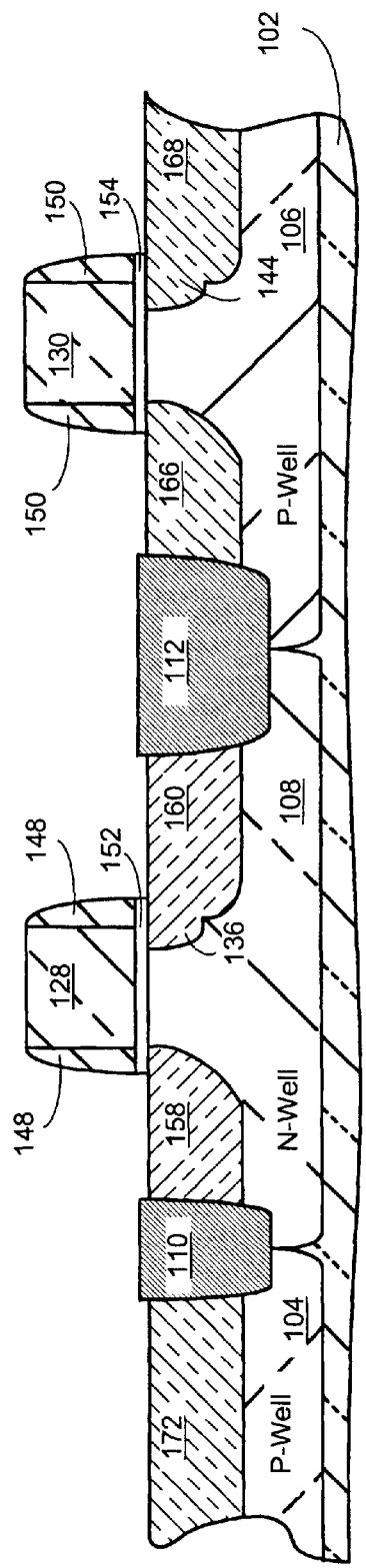

Referring now to FIG. 2E (PRIOR ART), therein is shown the RTA of the silicon substrate 102 after the formation of spacer 148 and 150 around polysilicon gates 128 and 130 and the ion implantation of dopants to form the P-type doped, deep source and drain junctions 158 and 160, the N-type doped, deep source and drain junctions 166 and 168 and the P-type doped, resistor region 172, similar to what were shown and described earlier in FIG. 1I through 1M. Again, the transient enhanced diffusion caused by the RTA inherently increases the displacement of the P-type doped, shallow drain extension junction 136, and N-type doped, shallow drain extension junction 144 into the channel region. The overlap portions between the shallow drain extension junction 136 (144), the gate oxide 152 (or 154), and the polysilicon gate 128 (or 130) forms parasitic capacitor. As explained in the Background Art, parasitic capacitors are highly undesirable because they slow down the switching speed of the transistor. The adverse speed impact increases disproportionately with shortened channels. Thus it is desirable to reduce the overlap portions.

To complete the formation of a metallic salicide in the areas where there are exposed doped regions or polysilicon gates, and the formation of an ESD resistor, silicon substrate 100 would be processed through steps similar to what were shown and described in FIGS. 1N through 1S.

In addition to the problems associated with parasitic capacitance due to the lateral diffusion of the LDD structures, this conventional True-LDD process also utilizes four masking steps to form the LDD regions and the deep source and drain regions (a True P-LDD mask, an N-LDD mask, a P+S/D mask, and an N+S/D mask). These masking steps increase fabrication complexity. Furthermore, it would be desirable to minimize hot carrier injections by improving the gradual doping profile.

The present invention provide methods to minimize the formation of hot carriers by improving the gradual doping profile in LDD structures, to simplify the process for forming LDD structures by lessening the number of masking steps, and to reduce the parasitic capacitance due to LDD structures without compromising transistor performance.

Figure 3C:
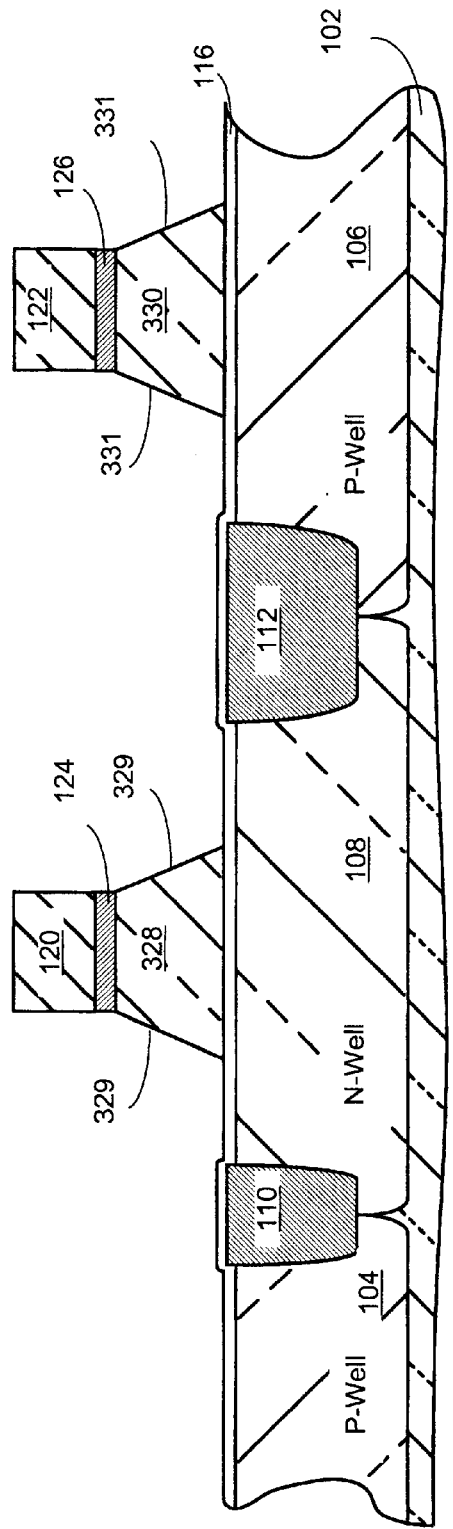
FIGS. 3A through 3P illustrate the sequence of process steps of a LDD process in accordance with the present invention for fabricating CMOS transistors with LDD structures in the source and drain regions, and an ESD resistor.
Figure 3D:
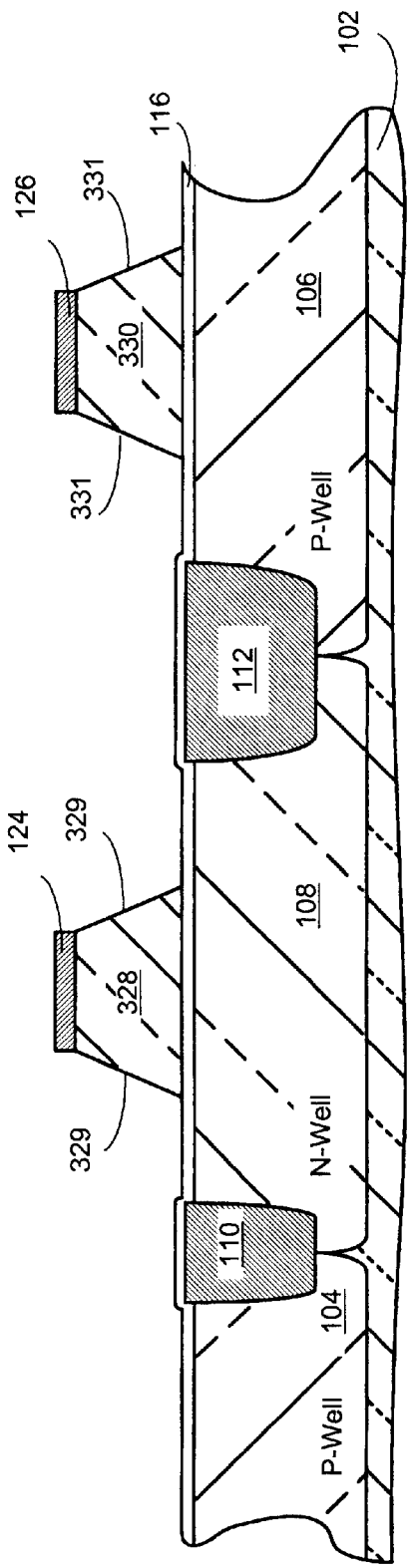
Figure 3G:
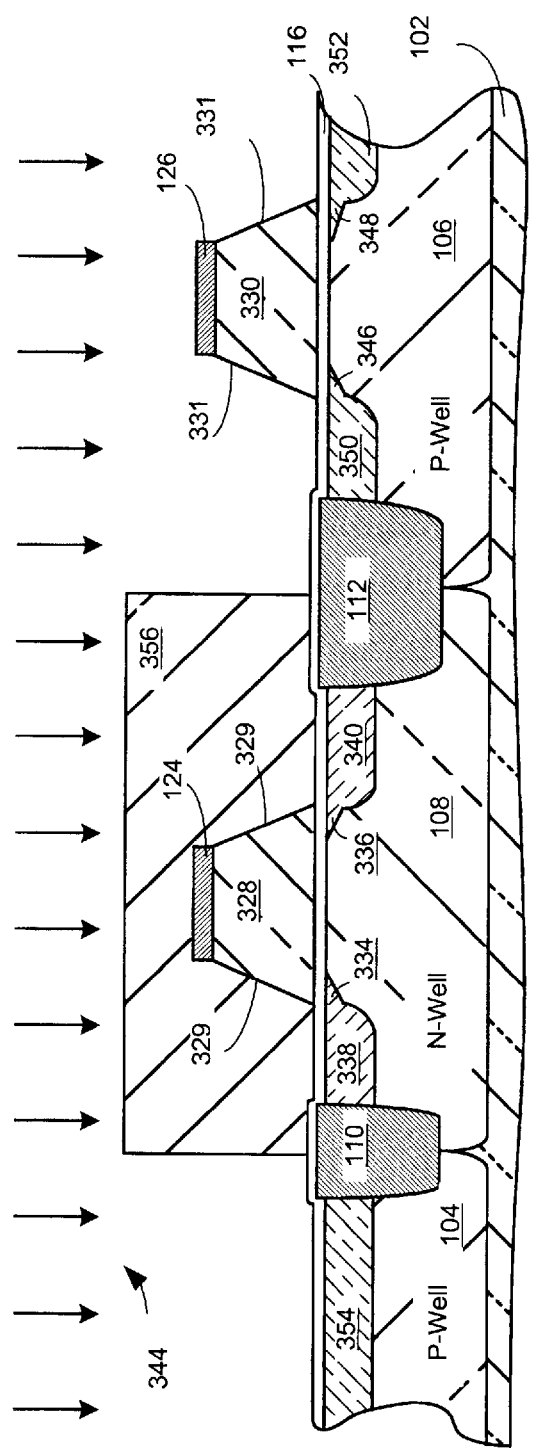
Figure 3H:
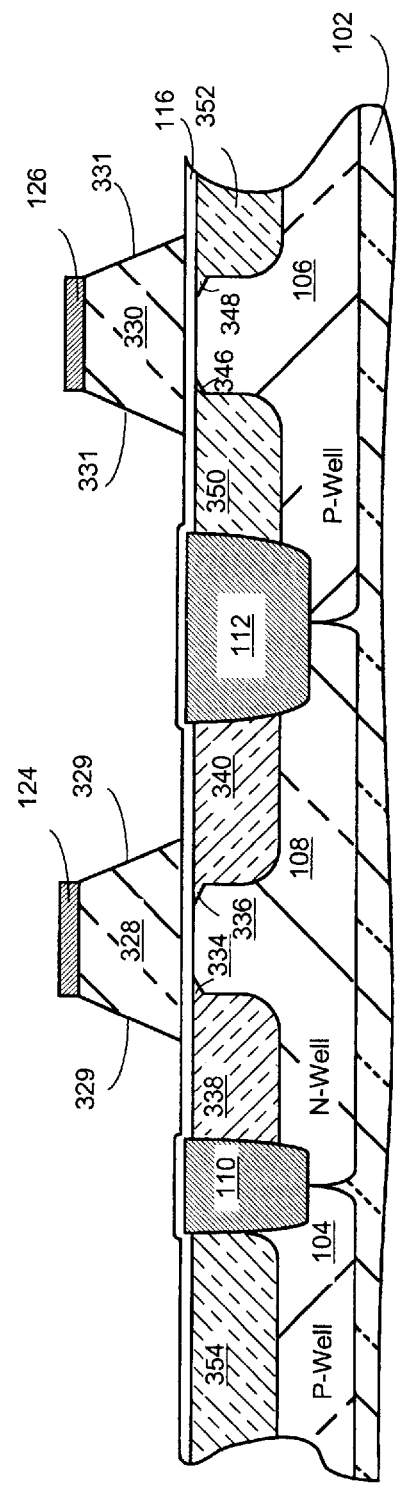
Figure 3K:
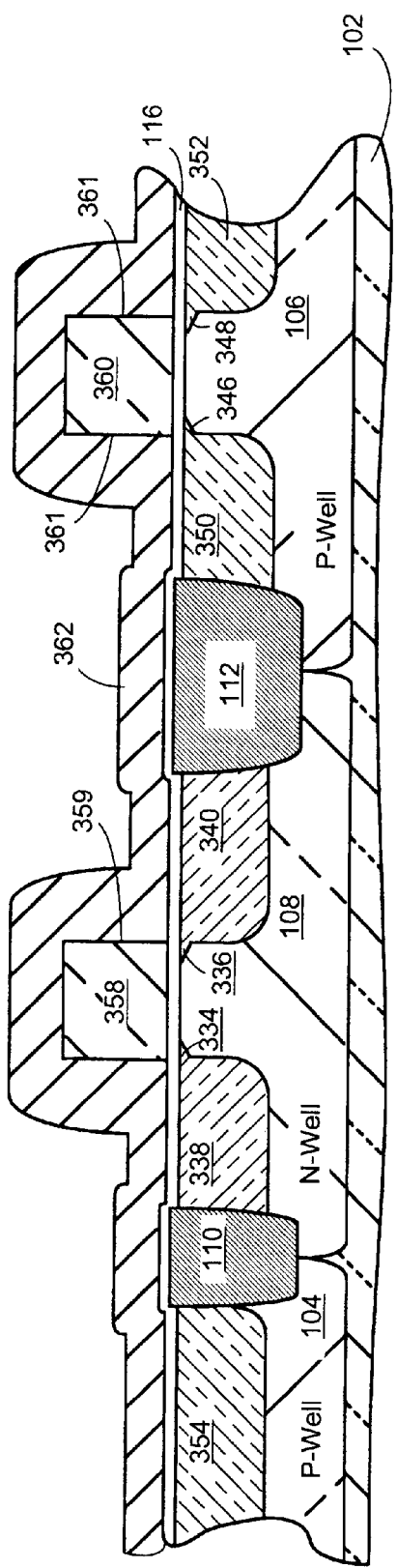
Figure 3L:
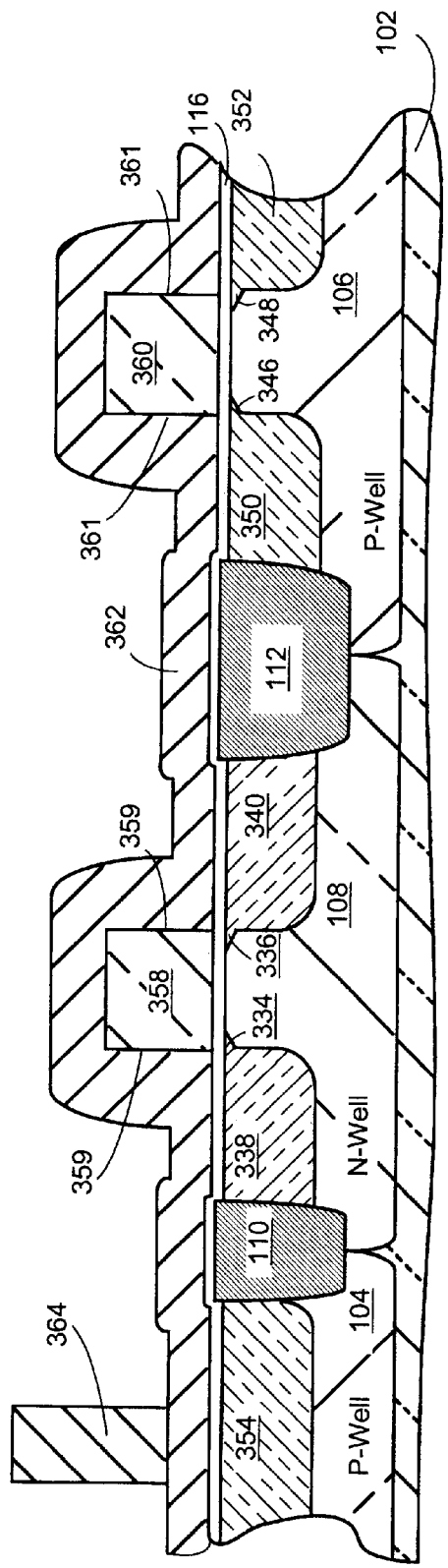
Figure 3M:
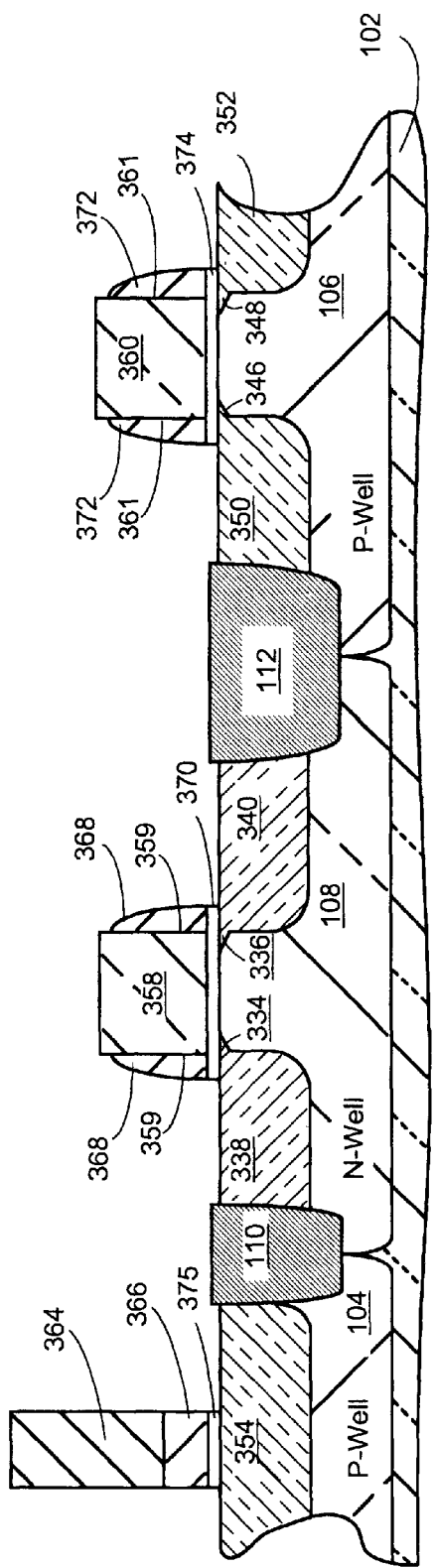
Figure 3N:
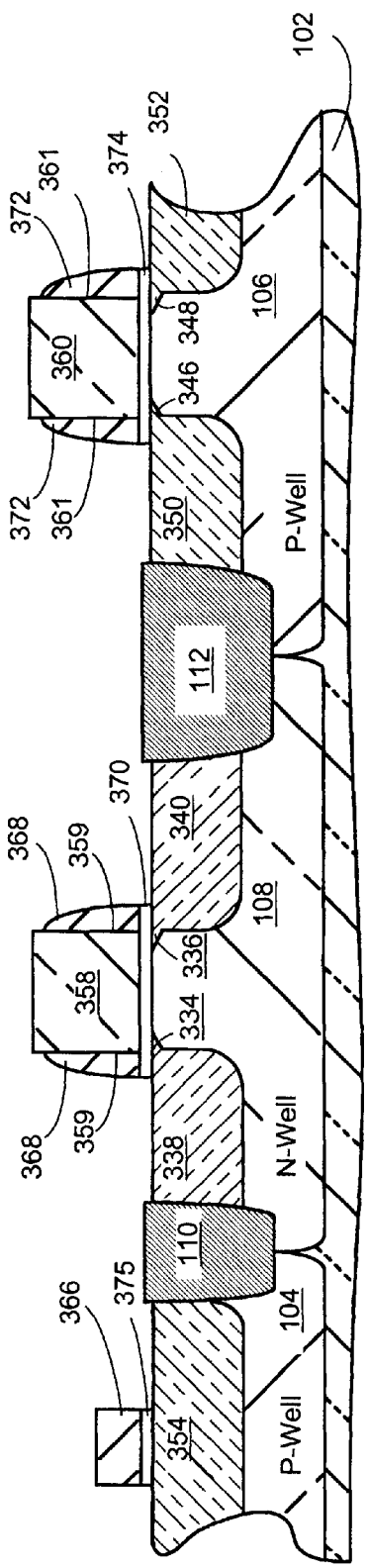
Figure 3O:
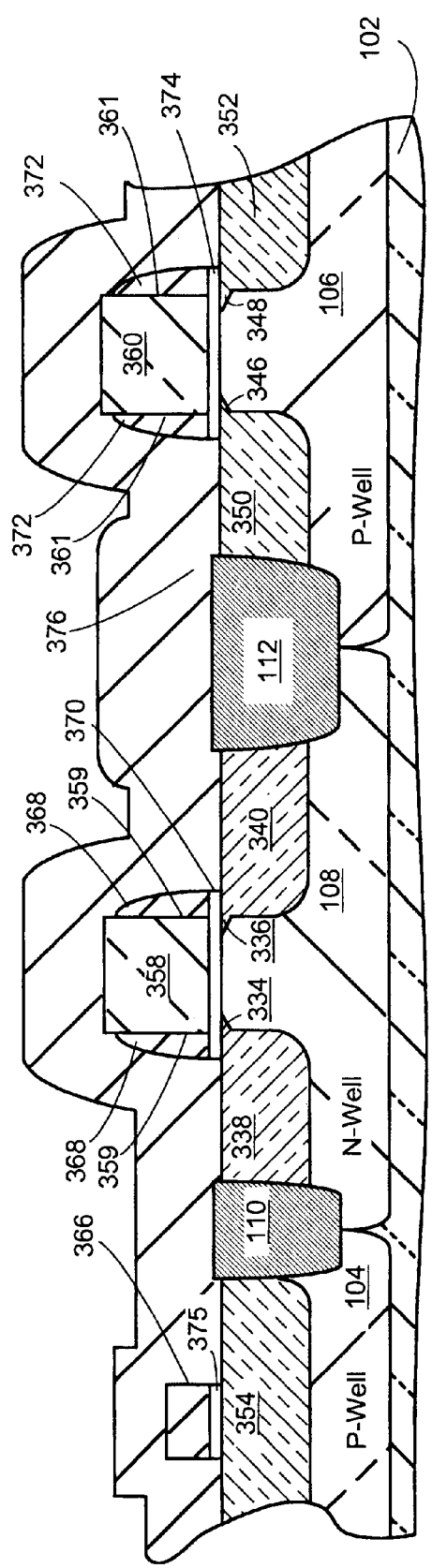
Figure 3P:
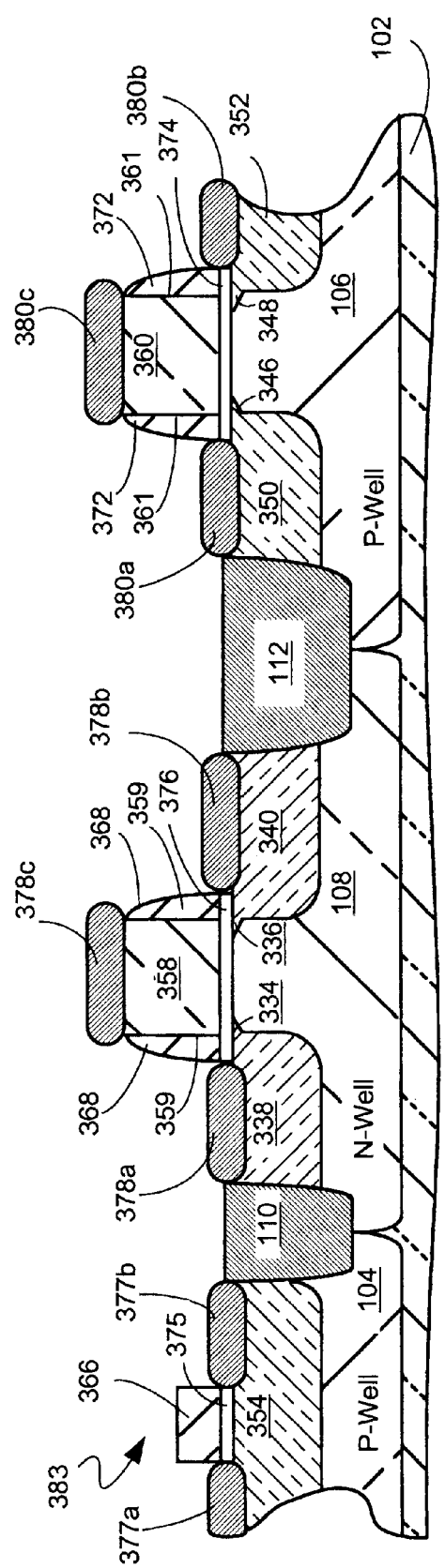

FIGS. 3A through 3P illustrate the sequence of process steps of a LDD process in accordance with the present invention for fabricating CMOS transistors with LDD structures in the source and drain regions, and an ESD resistor.

Referring now to FIG. 3A, therein is shown a crosssection of a semiconductor 100 in an intermediate stage of processing. For convenience of illustration, like reference numerals are used in FIG. 3A through 3O to denote like elements already described in FIG. 1A through 1S. FIG. 3A is identical to what was shown in FIG. 1A. At this stage are shown a silicon substrate 102 with two spaced P-well regions 104 and 106, and an N-well region 108 formed thereon. An ESD resistor for use with electrostatic protection circuits will be formed in the P-well 104.

Referring now to FIG. 3B, therein is shown the silicon substrate 102 after the conventional step of ARC etch to form patterned ARC mask 124 and 126 similar to what was shown in FIG. 1B.

Referring now to FIG. 3C, therein is shown the silicon substrate 102 after the step of polysilicon gate etch which forms two spaced polysilicon gates 328 and 330 in accordance with the present invention. The polysilicon gates 328 and 330 have sidewalls 329 and 331, respectively. Sidewalls 329 and 331 have sloped profiles. The sloped profiles can be achieved by adjusting one or more of the polysilicon gate etching parameters, such as the etching power, D.C. bias, magnetic field strength, and the amount of polymer buildup.

Referring now to FIG. 3D, therein is shown the silicon substrate 102 after the removal of the second masks 120 and 122 using the conventional steps of photoresist stripping.

Referring now to FIG. 3E, therein is shown the ion implantation 332 of a dopant at a first energy and a first concentration through the thin gate oxide 116 to form the P-type doped, shallow source and drain extension junctions 334 and 336, and the P-type doped, deep source and drain junctions 338 and 340. The P-type doped, shallow source and drain extension junctions 334 and 336 are formed under the influence of the sloped profile of sidewalls 329, resulting in junctions with graded doping profiles. The junction dopant concentrations at any point laterally along the shallow source and drain extension junctions 334 and 336 are inversely proportional to the thickness of the overlying polysilicon gate 328. Due to the graded doping profiles, shallow extension junctions 334 and 336 have an improved gradual doping profile which minimize $E_m$. When $E_m$ is minimized, the hot electron injections will be reduced. A conventional photolithographic masking process using a photoresist 342 (a P+implant mask) is used to prevent ion implantation 332 of the P-well regions 104 and 106.

Referring now to FIG. 3F, therein is shown the removal of the photoresist 342.

Referring now to FIG. 3G, therein is shown the ion implantation 344 of a dopant at a second energy and a second concentration through the thin gate oxide 116 to form the N-type doped, shallow source and drain extension junctions 346 and 348, and the N-type doped, deep source and drain junctions 350 and 352. The ion implantation 344 also forms an N-type doped, resistor region 354 in the P-well region 104. Again, the N-type doped, shallow source and drain extension junctions 346 and 348 are formed under the influence of the sloped profile of sidewalls 331 resulting in junctions with graded doping profiles. Similarly, a conventional photolithographic masking process using a photoresist 356 (an N+ implant mask) is used to prevent ion implantation 344 of the N-well region 108.

Referring now to FIG. 3H, therein is shown the removal of photoresist 356, followed by the RTA of the N-type doped, resistor region 354, the P-type doped, shallow source and drain extension junctions 334 and 336, the P-type doped, deep source and drain junctions 338 and 340, the N-typed doped, shallow source and drain extension junctions 346 and 348, the N-type doped, deep source and drain junctions 350 and 352. Similarly, the transient enhanced diffusion caused by the RTA inherently increases the displacement of the P-type doped, shallow source and drain extension junctions 334 and 336 and the N-type doped, shallow source and drain extension junctions 346 and 348 into their respective channel region.

Referring now to FIG. 3I, therein is shown the anisotropic etching of the polysilicon gates 328 and 330 using the patterned ARC mask 124 and 126 as masks to form polysilicon gates 358 and 360 with sidewalls 359 and 361. Sidewalls 359 and 361 have substantially vertical sidewall profiles. The P-type doped, shallow source and drain extension junctions 334 and 336, and the N-typed doped, shallow source and drain extension junctions 350 and 352 provide graded doping profiles that reduce $E_m$ and therefore minimize the formation of hot carrier injections. The overlap portion between the P-type doped, shallow source junction extension 334 (or 336), the gate oxide 116, and the poly-silicon gate 358 forms a parasitic capacitor. Similarly, the overlap portion between the N-type doped, shallow source junction extension 346 (or 348), the gate oxide 116, and the polysilicon gate 360 forms another parasitic capacitor. The more the overlap, the higher is the capacitance of the parasitic capacitors. As explained in the Background Art, parasitic capacitors are highly undesirable because they slow down the switching speed of the transistor. Due to the graded doping profiles in the P-type doped, shallow source and drain extension junctions 334 and 336, and the N-typed doped, shallow source and drain extension junctions 350 and 352, the LDD structures formed in accordance with the present invention have reduced parasitic capacitance as well as improved gradual doping profiles which minimize hot carrier injections.

Referring now to FIG. 3J, therein is shown the silicon substrate 102 after the conventional step of ARC removal.

Referring to FIG. 3K, therein is shown the deposition of a resistor protect film 362 over the N-type doped, resistor region 354, the STI 110, the P-type doped, deep source and drain junctions 338 and 340, the STI 112, the N-typed doped, deep source and drain junctions 350 and 352, and polysilicon gates 358 and 360.

Referring to FIG. 3L, therein is shown the deposition of a resistor protect mask 364 to mask a portion of the N-type doped, resistor region 354.

Referring to FIG. 3M, therein is shown the anisotropic etching of the resistor protect film 362 to form a resistor isolation 366 underneath the resistor protect mask 364, a sidewall spacers 368 over gate oxide 370 and around polysilicon gate 358, and a sidewall spacer 372 over gate oxide 374 and around polysilicon gate 360. An over-etch is used to expose the top portion of the polysilicon gates 358 and 360 by reducing the size and height of the spacers 368 and 372. At this stage, except for the gate oxides 370, 374, and 375, gate oxides in other area of the substrate 102 have been removed.

Referring to FIG. 3N, therein is shown the removal of the resistor protect mask 364.

Referring to FIG. 3O, therein is shown the deposition of a conductive or metallic layer 376 over the N-type doped, resistor region 354, the resistor isolation 366, the STI 110, the P-type doped, deep source and drain junctions 338 and 340, STI 112, the N-typed doped, deep source and drain junctions 350 and 352, the polysilicon gates 358 and 360, and the sidewall spacers 368 and 372.

Referring to FIG. 3P, therein is shown the thermal annealing of the silicon substrate 102 to form metallic salicide in the areas where the metallic layer 376 contacts exposed, doped silicon regions or polysilicon gates. Metallic salicide regions 377a and 377b are formed in the N-type doped, resistor region 354. The N-type doped, resistor region 354, the metallic salicide regions 377a and 377b, and the resistor isolation 366 form the ESD resistor 383. Metallic salicide regions 377a and 377b are the electrodes of the ESD resistors 383. Similarly, metallic salicide regions 378a and 378b are formed in the P-type doped, deep source and drain junctions 338 and 340, and metallic region 378c is formed in the polysilicon gate 358. Further, metallic regions 380a and 380b are formed in the N-type doped, deep source and drain junctions 350 and 352, and metallic region 380c is formed in the polysilicon gate 360.

In accordance with this embodiment of the present invention, CMOS devices with LDD structures in the source and drain regions of the transistors can be formed using only two masking steps (the P+ implant mask and the N+ implant mask). By reducing the masking steps, the present invention simplifies the fabrication process. In addition, graded shallow extension junctions are formed with reduced parasitic capacitance and improved gradual doping profiles that minimize hot carrier injections.

FIGS. 4A through 4F illustrate the sequence of process steps of another embodiment of the present invention for fabricating CMOS transistors with LDD structures in the source and drain regions and an ESD resistor for use with electrostatic protection circuits. For convenience of illustration, like reference numerals are used in FIG. 4A through 4F to denote like elements already described in FIGS. 1A through 1S, and FIGS. 3A through 3P.

Referring now to FIG. 4A, therein is shown the silicon substrate 102 after it had been processed through the identical steps as illustrated in FIGS. 3A through 3D. At this stage is shown the ion implantation 432 of a P-type dopant through the thin gate oxide 116 to form the P-type doped, LDD regions or shallow source and drain extension junctions 434 and 436. A conventional photolithographic masking process using a patterned photoresist 438 (a PLDD mask) is used to prevent ion implantation 432 of the P-well regions 104 and 106.

Referring now to FIG. 4B, therein is shown the removal of the photoresist 438.

Referring now to FIG. 4C, therein is shown the ion implantation 440 of a dopant through the thin gate oxide 116 to form the N-type doped, LDD regions or shallow source and drain extension junctions 442 and 444. Again, a conventional photolithographic masking process using a photoresist 446 (an N-LDD mask) is used to prevent ion implantation 440 of the P-well region 104 and N-well region 108.

Referring now to FIG. 4D, therein is shown the removal of photoresist 446.

Figure 4E:
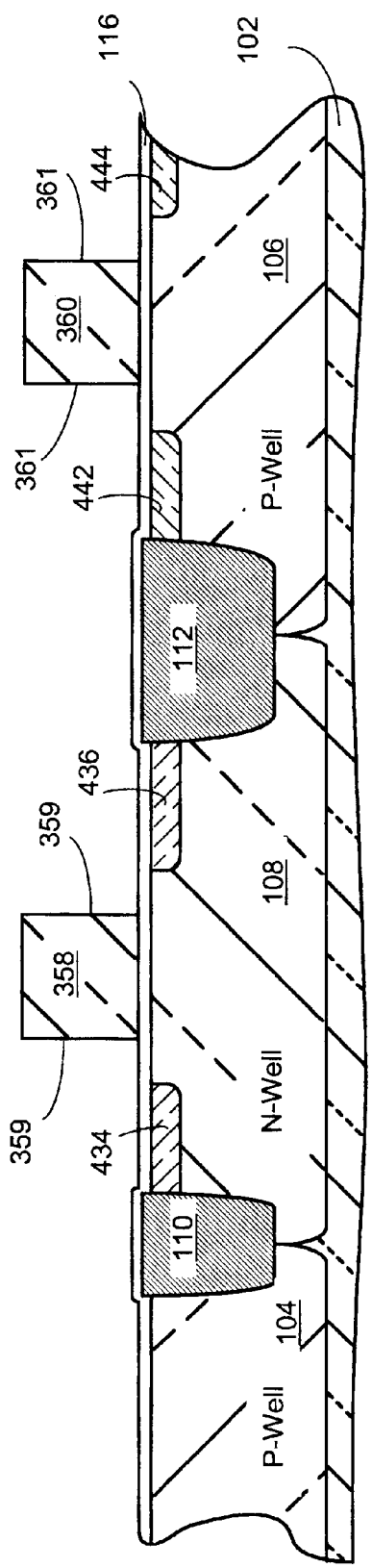

Referring now to FIG. 4E, therein is shown the anisotropic etching of the polysilicon gates 328 and 330 using the patterned ARC mask 124 and 126 as masks to form polysilicon gates 358 and 360 with sidewalls 359 and 361. Sidewalls 359 and 361 have substantially vertical sidewall profiles. The patterned ARC mask 124 and 126 is then removed. It should be noted that each of the P-type doped, shallow source and drain extension junctions 434 and 436, and the N-type doped, shallow source and drain extension junctions 442 and 444 is at a distance away from the edges of the respective polysilicon gates 358 and 360. The distance can be adjusted to be approximately equal to the lateral diffusion of the shallow source and drain extension junctions by controlling the sloped profiles of the sidewalls 329 and 331 of polysilicon gates 328 and 330, the implantation energy, the dopant concentration, or a combination thereof.

Figure 4F:
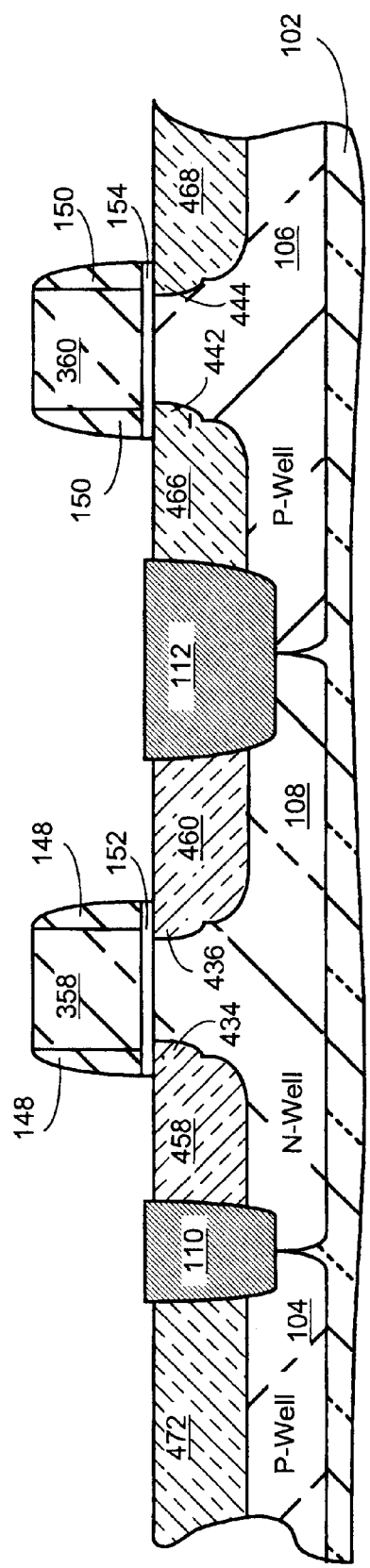

Referring now to FIG. 4F, therein is shown the RTA of the silicon substrate 102 as shown in FIG. 4E after the formation of spacer 148 and 150 around polysilicon gates 358 and 360 and the ion implantation of dopants to form the P-type doped, source and drain junctions 458 and 460, N-type doped, source and drain junctions 466 and 468 and P-type doped, resistor region 472, similar to what was shown and described earlier in FIG. 1I through 1M. Again, the transient enhanced diffusion caused by the RTA inherently increases the displacement of the P-type doped, shallow source and drain extension junctions 434 and 436, and N-type doped, shallow source and drain extension junctions 442 and 444 into the channel region. As mentioned earlier, the overlap portions between the shallow source/drain extension junctions 434 and 436 (442 and 444), the gate oxide 152 (or 154), and the polysilicon gate 358 (or 360) to form parasitic capacitors. However, unlike the conventional LDD process, the overlap portions are reduced since the shallow source/drain extension junctions 434 and 436 (or 442 and 444) are spaced away from the edges of polysilicon gates 358 (or 360) by distances which are approximately equal to the lateral diffusion of the shallow source and drain extension prior to the RTA. Accordingly, the resultant parasitic capacitances are reduced.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with this embodiment of the present invention, CMOS devices with LDD structures in the source and drain regions of the transistors can be formed with reduced parasitic capacitance.

FIGS. 5A through 5F illustrate the sequence of process steps of a True-LDD process in accordance with the present invention that when used in combination with the steps of FIGS. 3A through 3D, FIGS. 1I through 1L, and FIGS. 1N through 1S, form CMOS transistors with LDD structures only in the drain regions, and an ESD resistor. For convenience of illustration, like reference numerals are used in FIG. 5A through 5E to denote like elements already described in FIGS. 1A through 1S, FIGS. 3A through 3P, and FIGS. 4A through 4F.

Referring now to FIG. 5A, therein is shown the silicon substrate 102 after it had been processed through the identical steps as illustrated in FIGS. 3A through 3D. At this stage is shown the ion implantation 532 of a dopant through the thin gate oxide 116 to form the P-type doped, LDD region or shallow drain extension junction 536. A conventional photolithographic masking process using a photoresist 538 (a True P-LDD mask) is used to prevent ion implantation 532 of the source region (not shown) yet to be formed adjacent to the polysilicon gate 328 and opposite the shallow drain extension junction 536, and the P-well regions 104 and 106. It should be understood that the True P-LDD mask shown is extremely tolerant to tolerance variations in placement since it can fall any place on the patterned ARC mask 124.

Referring now to FIG. 5B, therein is shown the removal of the photoresist 538.

Figure 5C:
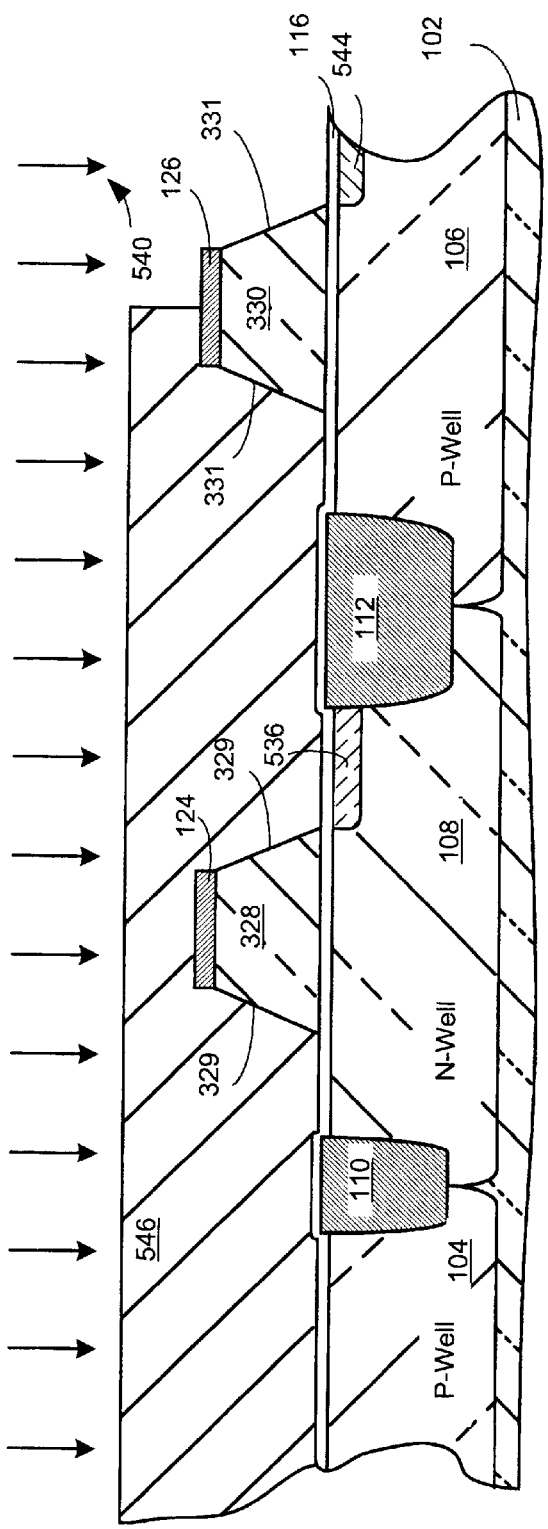

Referring now to FIG. 5C, therein is shown the ion implantation 540 of a dopant through the thin gate oxide 116 to form the N-type doped, LDD regions or shallow drain extension junction 544. Again, a conventional photolithographic masking process using a photoresist 546 (a True N-LDD mask) is used to prevent ion implantation 540 of the source region (not shown) yet to be formed adjacent to the polysilicon gate 330 and opposite the shallow drain extension junction 544, P-well region 104 and N-well region 108.

Figure 5D:
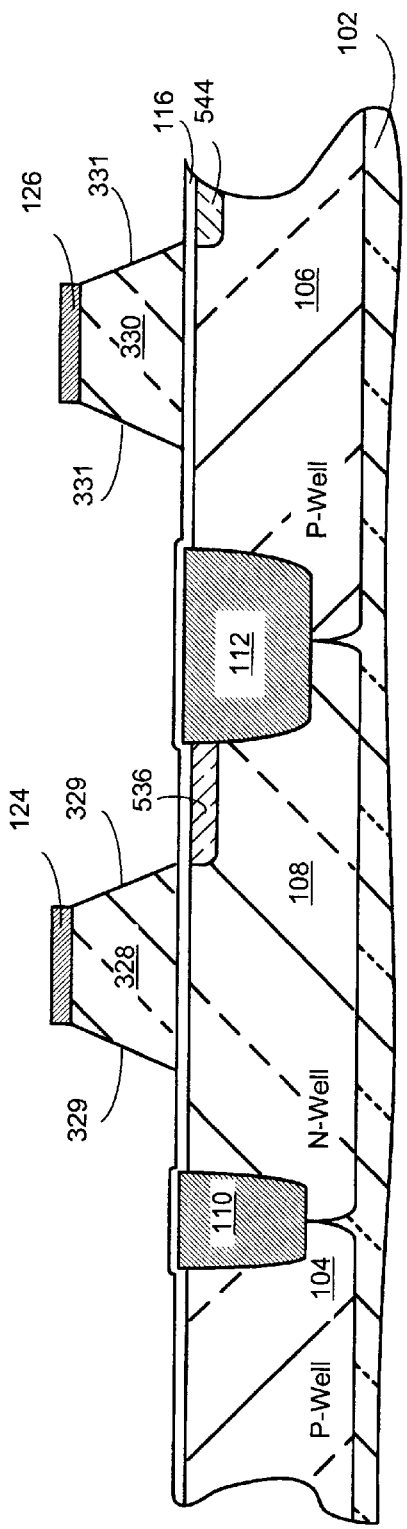

Referring now to FIG. 5D, therein is shown the removal of photoresist 546.

Figure 5E:
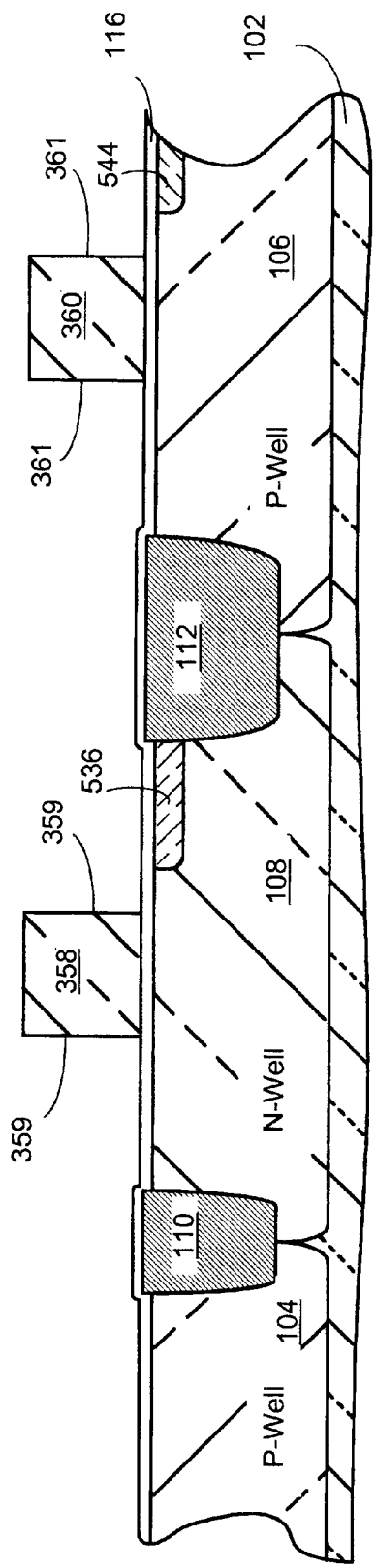

Referring now to FIG. 5E, therein is shown the anisotropic etching of the polysilicon gates 328 and 330 using the patterned ARC mask 124 and 126 as masks to form polysilicon gates 358 and 360 with having sidewalls 359 and 361. Sidewalls 359 and 361 have substantially vertical sidewall profiles. The patterned ARC masks 124 and 126 are then removed. Again, it should be noted that each of the P-type doped, shallow drain extension junction 536, and N-type doped, shallow drain extension junction 544 is at a distance away from the edges of the respective polysilicon gates 358 and 360. Similarly, the distance can be adjusted to be approximately equal to the lateral diffusion of the shallow source and drain extension junctions by controlling the sloped profiles of the sidewalls 329 and 331 of polysilicon gates 328 and 330, the implantation energy, the dopant concentration, or a combination thereof.

Figure 5F:
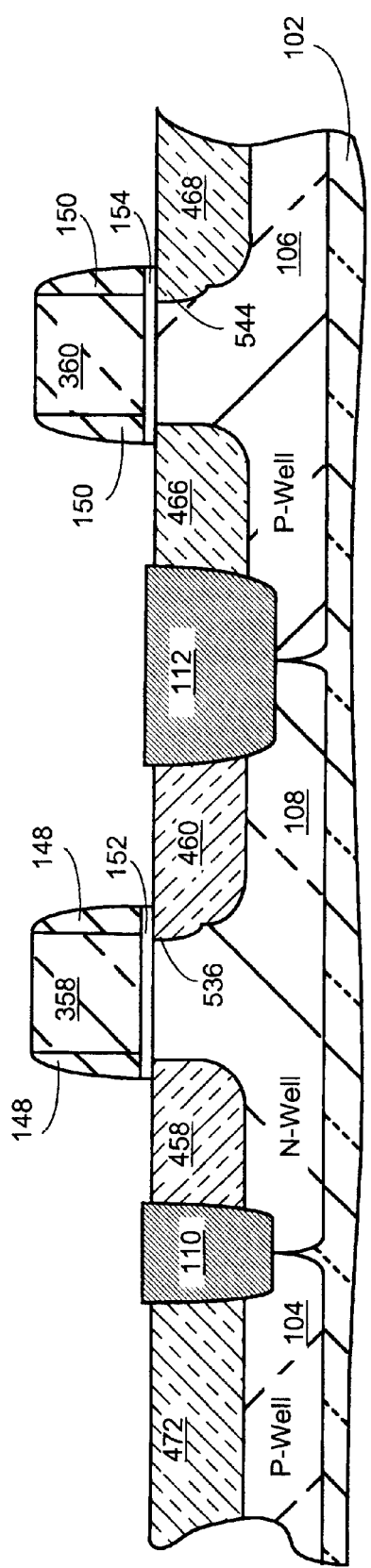

Referring now to FIG. 5F, therein is shown the RTA of the semiconductor structure as shown in FIG. 5F after the formation of spacer 148 and 150 around polysilicon gates 358 and 360 and the ion implantation of dopants to form the P-type doped, source and drain junctions 458 and 460, N-type doped, source and drain junctions 466 and 468 and P-type doped, resistor region 472, similar to what were shown and described earlier in FIG. 1I through 1M. Again, the transient enhanced diffusion caused by the RTA inherently increases the displacement of the P-type doped, shallow drain extension junction 536, and N-type doped, shallow drain extension junction 544 into the channel region. As mentioned early, the overlap portions between the shallow drain extension junction 536 (544), the gate oxide 152 (or 154), and the polysilicon gate 358 (or 360) to form parasitic capacitors. However, unlike the conventional True-LDD process, the overlap portions are reduced since the shallow drain extension junction 534 (or 544) was spaced away from the edges of polysilicon gates 358 (or 360) by a distance which is approximately equal to the lateral diffusion of the shallow source and drain extension prior to the RTA. Accordingly, the resultant parasitic capacitance is reduced.

To complete the formation of a metallic salicide in the areas where there are exposed doped, regions or polysilicon gates, and the formation of an ESD resistor, silicon substrate 102 would be processed through steps similar to what were shown and described in FIGS. 1N through 1S.

Thus, in accordance with this embodiment of the present invention, CMOS devices with True LDD structures, i.e., LDD structures formed only in the drain regions of the transistors, can be fabricated with reduced parasitic capacitance.

FIGS. 6A through 6B illustrate the sequence of process steps of another embodiment of the present invention for fabricating CMOS transistors with LDD structures in the source and drain regions. For convenience of illustration, like reference numerals are used in FIG. 6A through 6B to denote like elements already described in FIGS. 1A through 1S, FIGS. 3A through 3P, and FIG. 4A through 4F.

Referring now to FIG. 6A, therein is shown the silicon substrate 102 after it had been processed through the identical steps as illustrated in FIGS. 3A through 3D. At this stage is shown the ion implantation 632 of a P-type dopant at a first energy and a first concentration through the thin gate oxide 116 to form the P-type doped, LDD regions or shallow source and drain extension junctions 634 and 636. Similar to what was shown in FIG. 3E, the P-type doped, shallow source and drain extension junctions 634 and 636 are formed under the influence of the sloped profile of sidewalls 329, resulting in shallow extension junctions with graded doping profiles. The junction dopant concentrations at any point laterally along the shallow source and drain extension junctions 634 and 636 are inversely proportional to the thickness of the overlying polysilicon gate 328. Thus, the shallow extension junctions 634 and 636 have improved gradual doping profiles which minimize $E_m$. When $E_m$ is minimized, the hot electron injections will be reduced. However, unlike the previous embodiment as depicted in FIG. 3E, the first energy and the first concentration used in this embodiment are high enough to form shallow extension junctions 634 and 636 and low enough to prevent the formation of deep junctions. A conventional photolithographic masking process using a patterned photoresist 638 (a P-LDD mask) is used to prevent ion implantation 632 of the P-well regions 104 and 106.

Referring now to FIG. 6B, therein is shown the RTA of the silicon substrate 102 as shown in FIG. 6A after the formation of spacer 148 and 150 around polysilicon gates 358 and 360 and the ion implantation of dopants to form the P-type doped, deep source and drain junctions 658 and 660, N-type doped, deep source and drain junctions 666 and 668 and P-type doped, resistor region 472, similar to what was shown and described earlier in FIG. 1G through 1M. However, unlike what was shown in FIG. 1G through 1M, the N-type doped, shallow extension junctions 642 and 644 include graded doping profiles similar to shallow extension junctions 634 and 636. A second energy and a second concentration are used in the ion implantation step to form the shallow extension junctions 642 and 644. The second energy and the second concentration are controlled such that they are high enough to form the N-type doped, shallow extension junctions 642 and 644 and low enough to prevent the formation of deep junctions. Due to the graded doping profiles in the P-type doped, shallow source and drain extension junctions 634 and 636, and the N-typed doped, shallow source and drain extension junctions 642 and 644, the LDD structures formed in accordance with the present invention have reduced parasitic capacitances as well as improved gradual doping profiles that minimize the formation of hot carriers.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with this embodiment of the present invention, CMOS devices with LDD structures in the source and drain regions of the transistors can be formed with reduced parasitic capacitances as well as an improved gradual doping profiles that minimize the formation of hot carrier injections.

FIGS. 7A through 7B illustrate the sequence of process steps of a True-LDD process in accordance with the present invention that when used in combination with the steps of FIGS. 3A through 3D, FIGS. 1I through 1L, and FIGS. 1N through 1S, form CMOS transistors with LDD structures only in the drain regions, and an ESD resistor. For convenience of illustration, like reference numerals are used in FIGS. 5A through 5E to denote like elements already described in FIGS. 1A through 1S, FIGS. 3A through 3P, FIGS. 4A through 4F, FIGS. 5A through 5F, and FIGS. 6A through 6B.

Referring now to FIG. 7A, therein is shown the silicon substrate 102 after it had been processed through the identical steps as illustrated in FIGS. 3A through 3D. At this stage is shown the ion implantation 732 of a dopant through the thin gate oxide 116 to form the P-type doped, LDD region or shallow drain extension junction 736. A conventional photolithographic masking process using a photoresist 738 (a True P-LDD mask) is used to prevent ion implantation 732 of the source region (not shown) yet to be formed adjacent to the polysilicon gate 328 and opposite the shallow drain extension junction 736, and the P-well regions 104 and 106.

Similar to what was shown in FIG. 6A, the P-type doped, shallow drain extension junction 636 is formed under the influence of the sloped profile of sidewalls 329, resulting in a shallow extension junction with graded doping profiles. The junction dopant concentrations at any point laterally along the shallow drain extension junction 736 are inversely proportional to the thickness of the overlying polysilicon gate 328. Thus, the shallow drain extension junction 736 includes an improved gradual doping profile which minimizes $E_m$. When $E_m$ is minimized, the hot electron injections will be reduced. Again, the first energy and the first concentration used in this embodiment are high enough to form shallow extension junction 736 and low enough to prevent the formation of a deep junction.

Referring now to FIG. 7B, therein is shown the RTA of the silicon substrate 102 as shown in FIG. 6A after the formation of spacers 148 and 150 around polysilicon gates 358 and 360 and the ion implantation of dopants to form the P-type doped, deep source and drain junctions 758 and 760, N-type doped, deep source and drain junctions 766 and 768 and P-type doped, resistor region 472, similar to what was shown and described earlier in FIG. 1I through 1M. Again, the N-type doped, shallow drain extension junction 744 include graded doping profiles similar to shallow drain extension junction 736. Due to the graded doping profiles in the P-type doped, shallow drain extension junction 736, and the N-typed doped, shallow drain extension junction 744, the True-LDD structures formed in accordance with the present invention have reduced parasitic capacitance as well as an improved gradual doping profiles that minimize hot carrier injections.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with this embodiment of the present invention, CMOS devices with True-LDD structures can be formed with reduced parasitic capacitances as well as improved gradual doping profiles that minimize hot carrier injections.

In production of the first embodiment of the present invention, a conventional process is used to provide a silicon substrate 102 with two spaced P-well regions 104 and 106, and an N-well region 108 formed thereon (FIG. 3A). The P-well regions 104 and 106 have been doped with a P-type dopant which is one of the Group III elements such as boron difluoride ($BF_2$). The N-well region 108 has been doped with an N-type dopant which is one of the Group V elements such as phosphorus. Shallow trench isolations (STI) 110 and 112 are conventional formed between the P-well region 104 and the N-well region 108, and the P-well region 106 and N-well region 108, respectively. On top of the polysilicon layer is a first mask layer 118. The first mask layer 118 is an anti-reflective coating (ARC), which is typically of a silicon oxynitride layer, for enhancing the imaging effect in subsequent photolithography processing. On top of the ARC 118 are patterned second masks 120 and 122 which are typically of a photoresist material. The second masks 120 and 122 are conventionally formed by patterning and etching a second mask layer (not shown).

Next, a conventional step of ARC etch is used to form patterned ARC masks 124 and 126.

The next step is a polysilicon gate etch which forms two spaced polysilicon gates 128 and 130 in accordance with the present invention (shown in FIG. 2C). The polysilicon gates 128 and 130 have sidewalls 329 and 331, respectively. Sidewalls 329 and 331 have sloped profiles. The sloped profiles can be achieved by adjusting one polysilicon gate etching parameters, such as the etching power, D.C. bias, magnetic field strength, and the amount of polymer buildup, as would be evident to those having ordinary skill in this art.

Thereafter, a conventional step of photoresist stripping is used to remove the second masks 120 and 122.

The next step is the ion implantation 332 of a P-type dopant through the thin gate oxide 116 to form the P-type doped, shallow source and drain extension junctions 334 and 336, and the P-type doped, deep source and drain junctions 338 and 340. The P-type doped, shallow source and drain extension junctions 334 and 336 are formed under the influence of the sloped profile of sidewalls 329, resulting in junctions with graded doping profiles. The junction dopant concentrations at any point laterally along the shallow source and drain extension junctions 334 and 336 are inversely proportional to the thickness of the overlying polysilicon gate 328. The shallow extension junctions 334 and 336 have improved gradual doping profiles which minimize $E_m$. When $E_m$ is minimized, hot electron injections will be reduced. A conventional photolithographic masking process using a photoresist 342 (a P+ implant mask) is used to prevent ion implantation 332 of the P-well regions 104 and 106.

After the ion implantation of the P-type dopant, the photoresist 342 is removed.

The next step is another ion implantation 344 of a N-type dopant through the thin gate oxide 116 to form the N-type doped, shallow source and drain extension junctions 346 and 348, and the N-type doped, deep source and drain junctions 350 and 352. The ion implantation 344 also forms an N-type doped, resistor region 354 in the P-well region 104. Again, the N-type doped, shallow source and drain extension junctions 346 and 348 are formed under the influence of the sloped profile of sidewalls 331 resulting in junctions with graded doping profiles. Similarly, a conventional photolithographic masking process using a photoresist 356 (an N+ implant mask) is used to prevent ion implantation 344 of the N-well region 108.

The next step is the removal of photoresist 356, followed by the RTA of the N-type doped, resistor region 354, the P-type doped, shallow source and drain extension junctions 334 and 336, the P-type doped, deep source and drain junctions 338 and 340, the N-typed doped, shallow source and drain extension junctions 346 and 348, the N-type doped, deep source and drain junctions 350 and 352. The transient enhanced diffusion caused by the RTA inherently increases the displacement of the P-type doped, shallow source and drain extension junctions 334 and 336 and the N-type doped, shallow source and drain extension junctions 346 and 348 into their respective channel regions.

Next, an anisotropic etching is performed to etch the polysilicon gates 328 and 330 using the patterned ARC masks 124 and 126 as masks to form polysilicon gates 358 and 360 with substantially vertical sidewall profiles (as shown in 31). The P-type doped, shallow source and drain extension junctions 334 and 336, and the N-typed doped, shallow source and drain extension junctions 350 and 352 provide graded doping profiles that reduce $E_m$ and therefore minimize hot carrier injections.

Thereafter, the ARC masks 124 and 126 are removed.

After the removal of the ARC masks 124 and 126, the semiconductor is ready for further processing. The silicon substrate 102 is ready to have a resistor isolation 366 formed in the N-type doped, resistor region 354, a sidewall spacer 368 over gate oxide 370 and around polysilicon gate 358, and a sidewall spacer 372 over gate oxide 374 and around polysilicon gate 360 by the deposition of a resistor protect film, followed by patterning and etching using conventional technique. The sidewall spacers 368 and 372 shield portions of the P-type doped, deep source and drain junctions 338 and 340, and the deep source and drain junctions 350 and 352. An over-etch is used to expose the top portion of the polysilicon gates 358 and 360 by reducing the size and height of the spacers 368 and 372. At this stage, except for the gate oxides 370 and 374, gate oxides in other area of the substrate 102 have been removed.

After the removal of the resistor protect mask 364, a conductive or metallic layer 374 is deposited over the N-type doped, resistor region 354, the resistor isolation 366, the STI 110, the P-type doped, deep source and drain junctions 338 and 340, STI 112, the N-typed doped, deep source and drain junctions 350 and 352, the polysilicon gates 358 and 360, and the sidewall spacers 368 and 372. In the best mode, the metallic layer is a layer of titanium.

The next step is the thermal annealing of the silicon substrate 102 to form metallic salicide in the areas where the metallic layer 374 contacts exposed, doped silicon regions or polysilicon gates. Metallic salicide regions 376a and 376b are formed in the N-type doped, resistor region 354. The N-type doped, resistor region 354, the metallic salicide regions 376a and 376b, and the resistor isolation 366 form the ESD resistor 383. Similarly, metallic salicide regions 378a, 378b, and 378c are formed in the P-type doped, deep source and drain junctions 338 and 340 and the polysilicon gate 358, and metallic regions 380a, 380b and 380c are formed in the N-type doped, deep source and drain junctions 350 and 352 and the polysilicon gate 360.

In accordance with this embodiment of the present invention, CMOS devices with LDD structures in the source and drain regions of the transistors can be formed using only two masking steps (the P+ implant mask and the N+ implant mask). By reducing the masking steps, the present invention simplifies the fabrication process. In addition, graded shallow extension junctions are formed with improved gradual doping profiles that minimize hot carrier injections.

The method of making CMOS transistors according to the second embodiment of the present invention starts after the steps of FIGS. 3A through 3D of the first embodiment of the present invention. The next step is the ion implantation 432 of a P-type dopant through the thin gate oxide 116 to form the P-type doped, LDD regions or shallow source and drain extension junctions 434 and 436. A conventional photolithographic masking process using a patterned photoresist 438 (a P-LDD mask) is used to prevent ion implantation 432 of the P-well regions 104 and 106.

After the removal of the photoresist 438, another ion implantation 440 of an N-type dopant is performed through the thin gate oxide 116 to form the N-type doped, LDD regions or shallow source and drain extension junctions 442 and 444. Again, a conventional photolithographic masking process using a photoresist 446 (an N-LDD mask) is used to prevent ion implantation 440 of the P-well region 104 and N-well region 108.

The photoresist 446 is then removed.

The next step is the anisotropic etching of the polysilicon gates 328 and 330 using the patterned ARC masks 124 and 126 as masks to form polysilicon gates 358 and 360 with substantially vertical sidewall profiles. The patterned ARC masks 124 and 126 are then removed. It should be noted that each of the P-type doped, shallow source and drain extension junctions 434 and 436, and N-type doped, shallow source and drain extension junctions 442 and 444 is spaced at a distance away from the edges of the respective polysilicon gates 358 and 360. The distance can be adjusted to be approximately equal to the lateral diffusion of the shallow source and drain extension junctions by controlling the sloped profiles of the sidewalls 329 and 331 of polysilicon gates 328 and 330, the implantation energy, the dopant concentration, or a combination thereof.

The next step is the formation of spacer 148 and 150 around polysilicon gates 358 and 360, followed by the ion implantation of dopants to form the P-type doped, source and drain junctions 458 and 460, N-type doped, source and drain junctions 166 and 168 and P-type doped, resistor region 472, similar to what was shown and described earlier in the FIG. 1I through 1M of the conventional LDD process. Thereafter, the silicon substrate 102 is subjected to an RTA. Again, the transient enhanced diffusion caused by the RTA inherently increases the displacement of the P-type doped, shallow source and drain extension junctions 434 and 436, and N-type doped, shallow source and drain extension junctions 442 and 444 into the channel region. As mentioned earlier, the overlap portions between the shallow source/drain extension junctions 434 and 436 (442 and 444), the gate oxide 152 (or 154), and the polysilicon gate 358 (or 360) form parasitic capacitors. However, unlike the conventional LDD process, the overlap portions are reduced since the shallow source/drain extension junctions 434 and 436 (or 442 and 444) are spaced away from the edges of polysilicon gates 358 (or 360) by distances which are approximately equal to the lateral diffusion of the shallow source and drain extension prior to the RTA. Accordingly, the resultant parasitic capacitances are reduced.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with the second embodiment of the present invention, CMOS devices with LDD structures in the source and drain regions of the transistors can be formed with reduced parasitic capacitances.

The method of making CMOS transistors with True-LDD structures according to the third embodiment of the present invention starts after the steps of FIGS. 3A through 3D of the first embodiment of the present invention. The next step is the ion implantation 532 of a dopant through the thin gate oxide 116 to form the P-type doped, LDD region or shallow drain extension junction 536. A conventional photolithographic masking process using a patterned photoresist 538 (a True P-LDD mask) is used to prevent ion implantation 532 of the source region (not shown) yet to be formed adjacent to the polysilicon gate 328 and opposite the shallow drain extension junction 536, and the P-well regions 104 and 106. Next, the photoresist 538 is removed.

The next step is the ion implantation 540 of a dopant through the thin gate oxide 116 to form the N-type doped, LDD regions or shallow drain extension junction 544. Again, a conventional photolithographic masking process using a photoresist 546 (a True N-LDD mask) is used to prevent ion implantation 540 of the source region (not shown) yet to be formed adjacent to the polysilicon gate 330 and opposite the shallow drain extension junction 544, P-well region 104 and N-well region 108.

The photoresist 546 is then removed.

Thereafter, the polysilicon gates 328 and 330 are anisotropically etched using the patterned ARC masks 124 and 126 as masks to form polysilicon gates 358 and 360 with substantially vertical sidewall profiles. The patterned ARC masks 124 and 126 is then removed. Again, it should be noted that each of the P-type doped, shallow drain extension junction 536, and N-type doped, shallow drain extension junction 544 is spaced at a distance away from the edges of the respective polysilicon gates 358 and 360. Similarly, the distance can be adjusted to be approximately equal to the lateral diffusion of the shallow source and drain extension junctions by controlling the sloped profiles of the sidewalls 329 and 331 of polysilicon gates 328 and 330, the implantation energy, the dopant concentration, or a combination thereof.

The next step is the formation of spacer 148 and 150 around polysilicon gates 358 and 360, followed by the ion implantation of dopants to form the P-type doped, source and drain junctions 458 and 460, N-type doped, source and drain junctions 166 and 168 and P-type doped, resistor region 472, similar to what were shown and described earlier in FIG. 1I through 1M of the conventional LDD process. Again, the transient enhanced diffusion caused by the RTA inherently increases the displacement of the P-type doped, shallow drain extension junction 536, and N-type doped, shallow drain extension junction 544 into the channel region. As mentioned early, the overlap portions between the shallow drain extension junction 536 (544), the gate oxide 152 (or 154), and the polysilicon gate 358 (or 360) form parasitic capacitors. However, unlike the conventional True-LDD process, the overlap portion is reduced since the shallow drain extension junction 534 (or 544) was spaced away from the edges of polysilicon gate 358 (or 360) by a distance which is approximately equal to the lateral diffusion of the shallow source and drain extension prior to the RTA. Accordingly, the resultant parasitic capacitance is reduced.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S of the conventional LDD process.

Thus, in accordance with the third embodiment of the present invention, CMOS devices with True-LDD structures, i.e., LDD structures formed only in the drain regions of the transistors, can be fabricated with reduced parasitic capacitances.

The method of making CMOS transistors according to the fourth embodiment of the present invention starts after the steps of FIGS. 3A through 3D. The next step is the ion implantation 632 of a P-type dopant at a first energy and a first concentration through the thin gate oxide 116 to form the P-type doped, shallow source and drain extension junctions 634 and 636. The P-type doped, shallow source and drain extension junctions 634 and 636 are formed under the influence of the sloped profile of sidewalls 329, resulting in shallow extension junctions with graded doping profiles. The shallow extension junctions 634 and 636 have improved gradual doping profiles which minimize $E_m$. When $E_m$ is minimized, the hot electron injections will be reduced. The first energy and the first concentration used in this embodiment are high enough to form shallow extension junctions 634 and 636 and low enough to prevent the formation of deep junctions. A conventional photolithographic masking process using a patterned photoresist 638 (a P-LDD mask) is used to prevent ion implantation 632 of the P-well regions 104 and 106.

The next step is the ion implantation of dopants to form the N-type doped, shallow extension junctions 642 and 644. Again the second energy and the second concentration are controlled such that they are high enough to form shallow extension junctions 642 and 644 and low enough to prevent the formation of deep junctions. The next step is the ion implantation of dopants to form the N-type doped, P-type doped, deep source and drain junctions 658 and 660, N-type doped, deep source and drain junctions 666 and 668 and P-type doped, resistor region 472, which is then followed by a RTA step.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with the fourth embodiment of the present invention, CMOS devices with True-LDD structures, i.e., LDD structures formed only in the drain regions of the transistors, can be fabricated with reduced parasitic capacitance.

The method of making CMOS transistors with True-LDD structures according to the fifth embodiment of the present invention starts after the steps of FIGS. 3A through 3D. The next step is the ion implantation 732 of a P-type dopant at a first energy and a first concentration through the thin gate oxide 116 to form the P-type doped, shallow drain extension junctions 736. The P-type doped, shallow drain extension junction 736 are formed under the influence of the sloped profile of sidewalls 329, resulting in graded doping profiles in the P-type doped, shallow drain extension junction 736. The P-type doped, shallow drain extension junction 736 has an improved gradual doping profile which minimizes $E_m$. When $E_m$ is minimized, the hot electron injections will be reduced. Again, the first energy and the first concentration used in this embodiment are high enough to form the P-type doped, shallow extension junctions 736 and low enough to prevent the formation of deep junctions.

A conventional photolithographic masking process using a photoresist 738 (a True P-LDD mask) is used to prevent ion implantation 732 of the source region (not shown) yet to be formed adjacent to the polysilicon gate 328 and opposite the P-type doped, shallow drain extension junction 736, and the P-well regions 104 and 106.

The next step is the ion implantation of dopants to form the N-type doped, shallow drain extension junction 744. Again the second energy and the second concentration are controlled such that they are high enough to form the N-type doped, shallow extension junction 744 and low enough to prevent the formation of deep junctions. The next step is the ion implantation of dopants to form the P-type doped, deep source and drain junctions 758 and 760, N-type doped, deep source and drain junctions 766 and 768 and P-type doped, resistor region 472, which is then followed by a RTA step.

To complete the formation of a metallic salicide in the areas where there are exposed doped regions or polysilicon gates, and the formation of an ESD resistor, silicon substrate 102 would be processed through steps similar to what were shown and described in FIGS. 1N through 1S.

Thus, in accordance with the fifth embodiment of the present invention, CMOS devices with True-LDD structures can be formed with reduced parasitic capacitances as well as improved gradual doping profiles that minimize hot carrier injections.

As would be evident to those skilled in the art, CMOS devices that include LDD structures with graded doping profiles could be formed that are spaced away from the edges of the first polysilicon gates by adjusting the sloped sidewall profiles of the first polysilicon gates, the implantation energy, the dopant concentration, or a combination thereof, all in accordance with the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing a complementary MOS structure on a semiconductor substrate, comprising:

forming a gate oxide layer over the semiconductor substrate;

forming a polysilicon layer over said gate oxide layer;

forming a first mask layer over said polysilicon layer;

patterning and etching said first mask layer to form a first gate mask and a second gate mask;

anisotropically etching said polysilicon layer to form a first polysilicon gate and a second polysilicon gate, each of said first polysilicon gate and said second polysilicon gate has sidewalls with sloped profiles, said sidewalls of said first polysilicon gate and said sidewalls of said second polysilicon gate respectively shield a first portion and a second portion of the semiconductor substrate;

forming a second mask layer over a portion of the semiconductor substrate containing said second polysilicon gate;

implanting the semiconductor substrate in a first implantation with a first dopant of a first conductivity type at a first energy and a first concentration to form one or more first shallow extension junctions in the semiconductor substrate;

removing said second mask layer;

forming a third mask layer over a portion of the semiconductor substrate containing said first polysilicon gate and said one or more first shallow extension junctions;

implanting the semiconductor substrate in a second implantation with a second dopant of a second conductivity type at a second energy and a second concentration to form one or more second shallow extension junctions and a doped resistor region in said semiconductor substrate;

anisotropically etching said first polysilicon gate and said second polysilicon gate to respectively form a third polysilicon gate and a fourth polysilicon gate using said first gate mask and said second gate mask as masks, wherein each of said third polysilicon gate and said fourth polysilicon gate has sidewalls with substantially vertical profiles;

removing said first gate mask and said second gate mask;

forming a resistor protect layer over said gate oxide layer, said doped resistor region, said third polysilicon gate, and said fourth polysilicon gate;

selectively masking said resistor protect layer with a resistor protect mask on said doped resistor region where a resistor isolation is to be formed;

anisotropically etching said resistor protect layer to form said resistor isolation under said resistor protect mask, a first sidewall spacer around said third polysilicon gate, said first sidewall spacer shields portions of said first shallow extension junctions, and a second sidewall spacer around said fourth polysilicon gate, said second sidewall spacer shields portions of said second shallow extension junctions, wherein said anisotropically etching of said resistor protect layer has over-etching said resistor protect layer to reduce dimensions of said first sidewall spacer and said second sidewall spacer so that top portions of said third polysilicon gate and said fourth polysilicon gate are exposed; and removing said resistor protect mask to expose said resistor isolation.

2. The method as claimed in claim 1 wherein:

implanting the semiconductor substrate in said first implantation includes penetrating portions of said sidewalls of said first polysilicon gate with said first dopant to form said first shallow extension junctions, said first shallow extension junctions are graded junctions; and implanting the semiconductor in said second implantation includes penetrating portions of said sidewalls of said second polysilicon gate to form said second shallow extension junctions, said second shallow extension junctions are graded junctions.

3. The method as claimed in claim 1 wherein:

implanting the semiconductor substrate in said first implantation with said first dopant forms first deep junctions in a portion of the semiconductor substrate not shielded by said first polysilicon gate and adjacent said first shallow extension junctions; and implanting the semiconductor substrate in said second implantation with said second dopant forms second deep junctions in a portion of the semiconductor substrate not shielded by said second polysilicon gate and adjacent said second shallow extension junctions.

4. The method as claimed in claim 1 including:

forming a metallic layer over said doped resistor region, said third polysilicon gate, said fourth polysilicon gate, said first sidewall spacer, said second sidewall spacer, said first shallow extension junctions, and said second shallow extension junctions after removing said resistor protect mask to expose said resistor isolation; and annealing the semiconductor substrate to form a metallic salicide over the top portions of said third polysilicon gate and said fourth polysilicon gate, and portions of said first and second shallow extension junctions that are not shielded by said first and said second sidewall spacers.

5. A method for manufacturing a complementary MOS structure on a semiconductor substrate, comprising:

forming a gate oxide layer over the semiconductor substrate;

forming a polysilicon layer over said gate oxide layer;

forming a first mask layer over said polysilicon layer;

patterning and etching said first mask layer to form a first gate mask and a second gate mask;

anisotropically etching said polysilicon layer to form a first polysilicon gate and a second polysilicon gate, each of said first polysilicon gate and said second polysilicon gate has sidewalls with sloped profiles, said sidewalls of said first polysilicon gate and said sidewalls of said second polysilicon gate respectively shield a first portion and a second portion of the semiconductor substrate;

forming a second mask layer over a portion of the semiconductor substrate containing said second polysilicon gate;

implanting the semiconductor substrate in a first implantation with a first dopant of a first conductivity type at a first energy and a first concentration to form one or more first shallow extension junctions in the semiconductor substrate and first deep junctions in a portion of the semiconductor substrate not shielded by said first polysilicon gate and adjacent said first shallow extension junctions, and wherein said first dopant penetrates portions of said sidewalls of said first polysilicon gate to form said first shallow extension junctions, said first shallow extension junctions are graded junctions;

removing said second mask layer;

forming a third mask layer over a portion of the semiconductor substrate containing said first polysilicon gate and said one or more first shallow extension junctions;

implanting the semiconductor substrate in a second implantation with a second dopant of a second conductivity type at a second energy and a second concentration to form one or more second shallow junctions and a doped resistor region in said semiconductor substrate, and second deep junctions in a portion of the semiconductor substrate not shielded by said second polysilicon gate and adjacent said second shallow extension junctions, wherein said second dopant penetrates portions of said sidewalls of said second polysilicon gate to form said second shallow extension junctions, said second shallow extension junctions are graded junctions;

anisotropically etching said first polysilicon gate and said second polysilicon gate to respectively form a third polysilicon gate and a fourth polysilicon gate using said first gate mask and said second gate mask as masks, wherein said each of said third polysilicon gate and said fourth polysilicon gate has sidewalls with substantially vertical profiles;

removing said first gate mask and said second gate mask;

forming a resistor protect layer over said gate oxide layer, said doped resistor region, said third polysilicon gate, and said fourth polysilicon gate;

selectively masking said resistor protect layer with a resistor protect mask on said doped resistor region where a resistor isolation is to be formed;

anisotropically etching said resistor protect layer to form said resistor isolation under said resistor protect mask, a first sidewall spacer around said third polysilicon gate, said first sidewall spacer shields portions of said first deep junctions, and a second sidewall spacer around said fourth polysilicon gate, said second sidewall spacer shields portions of said second deep junctions, wherein anisotropically etching said resistor protect layer has over-etching said resistor protect layer to reduce dimensions of said first sidewall spacer and said second sidewall spacer so that top portions of said third polysilicon gate and said fourth polysilicon gate are exposed; and removing said resistor protect mask to expose said resistor isolation.

6. The method as claimed in claim 5 including:

forming a metallic layer over said doped resistor region, said third polysilicon gate, said fourth polysilicon gate, said first sidewall spacer, said second sidewall spacer, said first deep junctions, and said second deep junctions after removing said resistor protect mask to expose said resistor isolation; and annealing the semiconductor substrate to form a metallic salicide over the top portions of said third polysilicon gate and said fourth polysilicon gate, and portions of said first and second deep junctions that are not shielded by said first and said second sidewall spacers.

* * * * *